(12) United States Patent
 Ito

(10) Patent No.: US 11,626,539 B2
(45) Date of Patent: Apr. 11, 2023

(54) SEMICONDUCTOR LIGHT EMITTING DEVICE AND METHOD FOR MANUFACTURING SEMICONDUCTOR LIGHT EMITTING DEVICE

(71) Applicant: ROHM CO., LTD., Kyoto (JP)

(72) Inventor: Yohei Ito, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 17/583,690

(22) Filed: Jan. 25, 2022

(65) Prior Publication Data

US 2022/0149242 A1 May 12, 2022

Related U.S. Application Data

(62) Division of application No. 16/597,453, filed on Oct. 9, 2019, now Pat. No. 11,271,139.

(30) Foreign Application Priority Data

Oct. 12, 2018 (JP) .............................. JP2018-193531
Jul. 16, 2019 (JP) .............................. JP2019-131237

(51) Int. Cl.
 *H01L 21/02* (2006.01)
 *H01L 33/38* (2010.01)
 (Continued)

(52) U.S. Cl.
 CPC ...... *H01L 33/382* (2013.01); *H01L 21/02271* (2013.01); *H01L 33/0062* (2013.01);
 (Continued)

(58) Field of Classification Search
 CPC ............ H01L 33/382; H01L 21/02271; H01L 33/0062; H01L 33/30; H01L 33/305;
 (Continued)

(56) References Cited

U.S. PATENT DOCUMENTS

2009/0050930 A1 2/2009 Yao et al.

FOREIGN PATENT DOCUMENTS

CN 104241489 A 12/2014
JP H06334218 A 12/1994
 (Continued)

OTHER PUBLICATIONS

Office Action dated Feb. 9, 2023, in the counterpart of the Japanese Patent Application No. 2019131237.

*Primary Examiner* — Elias Ullah
(74) *Attorney, Agent, or Firm* — Rabin & Berdo, P.C.

(57) ABSTRACT

Method for manufacturing semiconductor light-emitting device having a substrate, a metal layer over the substrate, and a semiconductor layer over the metal layer. The semiconductor layer includes a light-emitting layer, and with respect to the light-emitting layer, a first conductivity type layer at a substrate side and a second conductivity type layer opposite the substrate. The second conductivity type layer includes a first layer forming a semiconductor layer surface and a second layer at the substrate side with respect to the first layer. The method includes exposing a second layer surface by selectively removing the first layer, forming an uneven surface portion of the second layer by frost processing the exposed surface, forming an electrode over the first layer, forming a space between an end portion of the first layer and a peripheral edge of the electrode by side-etching the first layer toward a lower side of the electrode using a nitric acid-based dilute solution, and forming another electrode below the substrate.

5 Claims, 37 Drawing Sheets

(51) Int. Cl.
    *H01L 33/30*           (2010.01)
    *H01L 33/00*           (2010.01)
    *H01L 33/62*           (2010.01)

(52) U.S. Cl.
    CPC ............ *H01L 33/30* (2013.01); *H01L 33/305* (2013.01); *H01L 33/62* (2013.01); *H01L 2933/0016* (2013.01); *H01L 2933/0066* (2013.01)

(58) Field of Classification Search
    CPC ............. H01L 33/62; H01L 2933/0016; H01L 2933/0066; H01L 33/22; H01L 33/38
    See application file for complete search history.

(56) References Cited

FOREIGN PATENT DOCUMENTS

| | | | |
|---|---|---|---|
| JP | 2005175462 A | 6/2005 | |
| JP | 2014120695 A | 6/2014 | |
| JP | 2017050392 A | 3/2017 | |

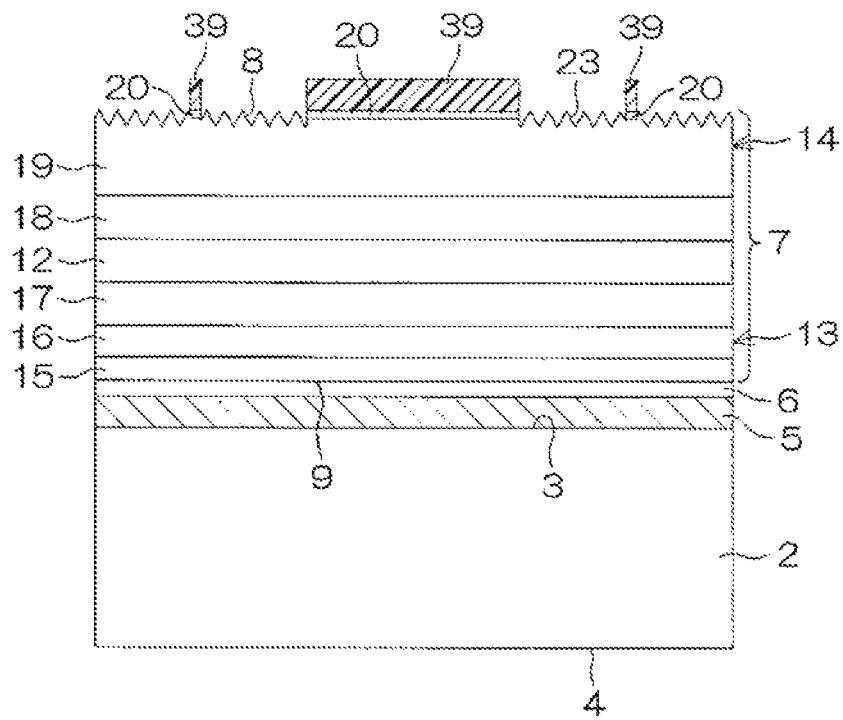

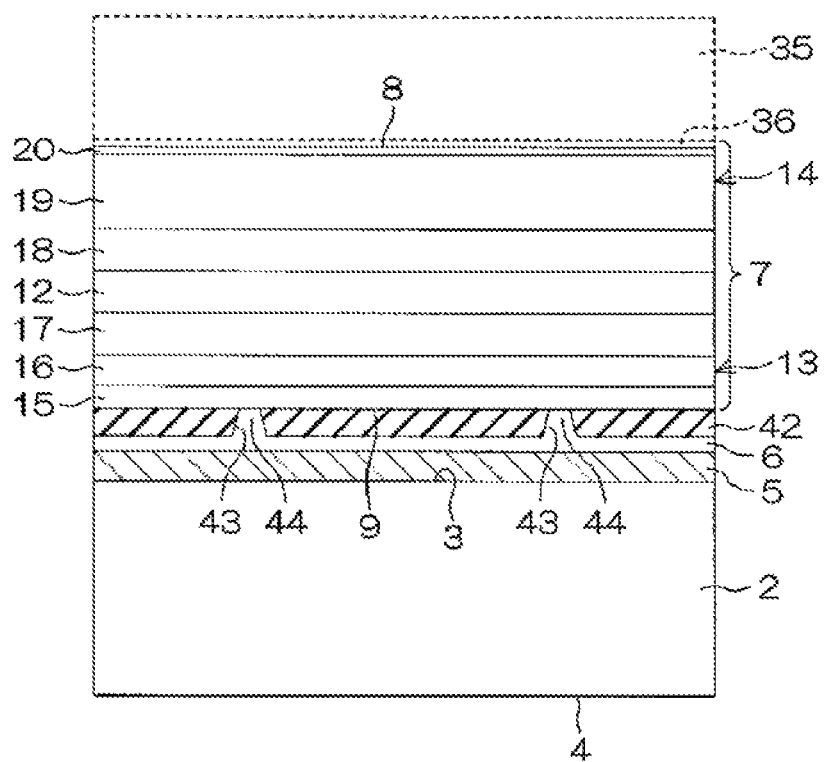

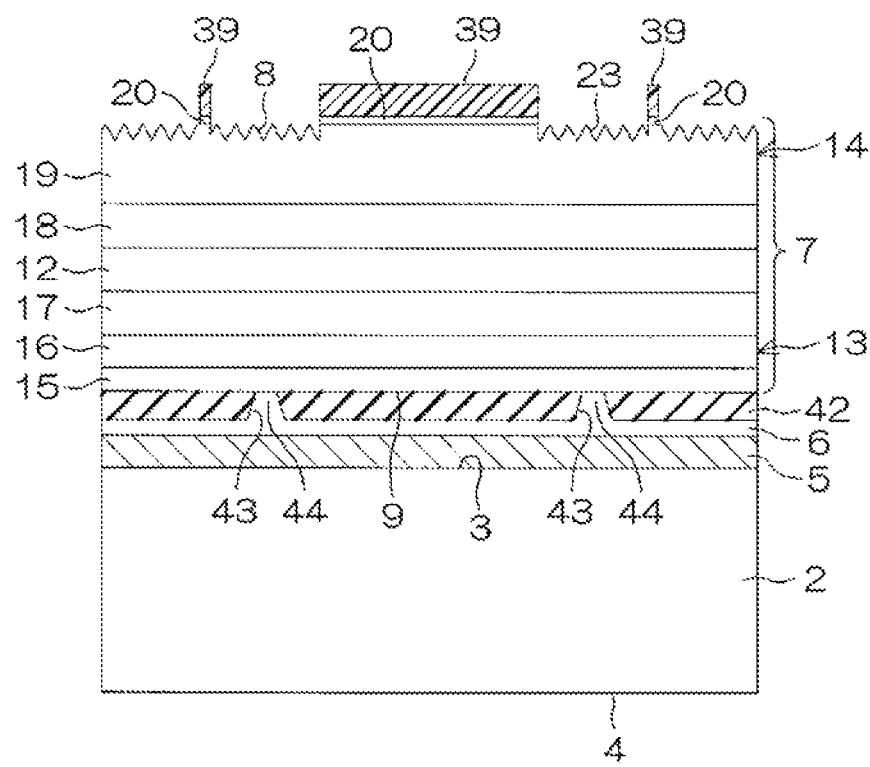

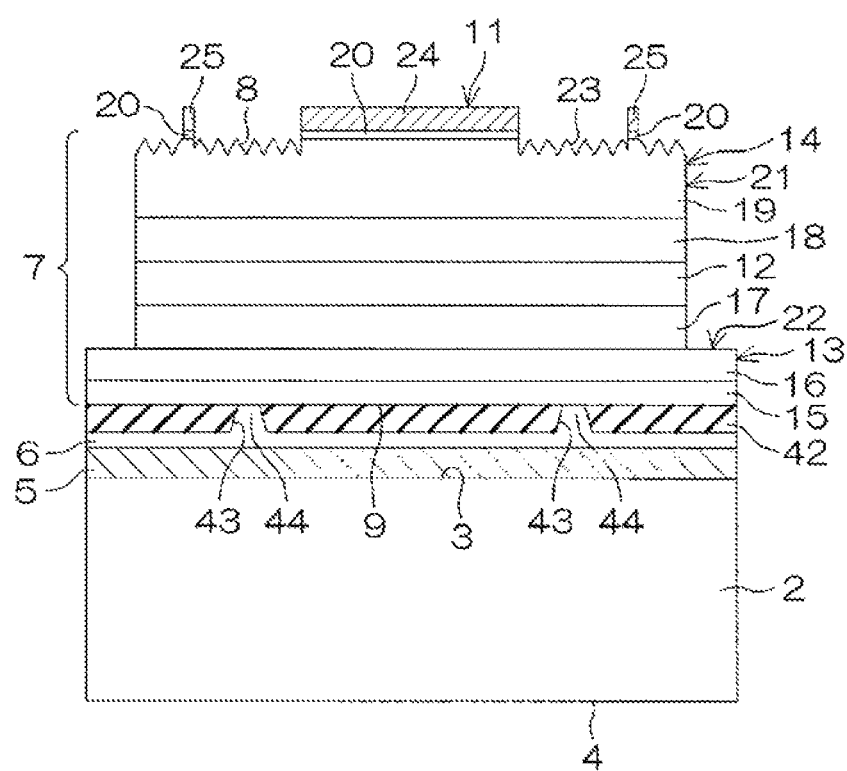

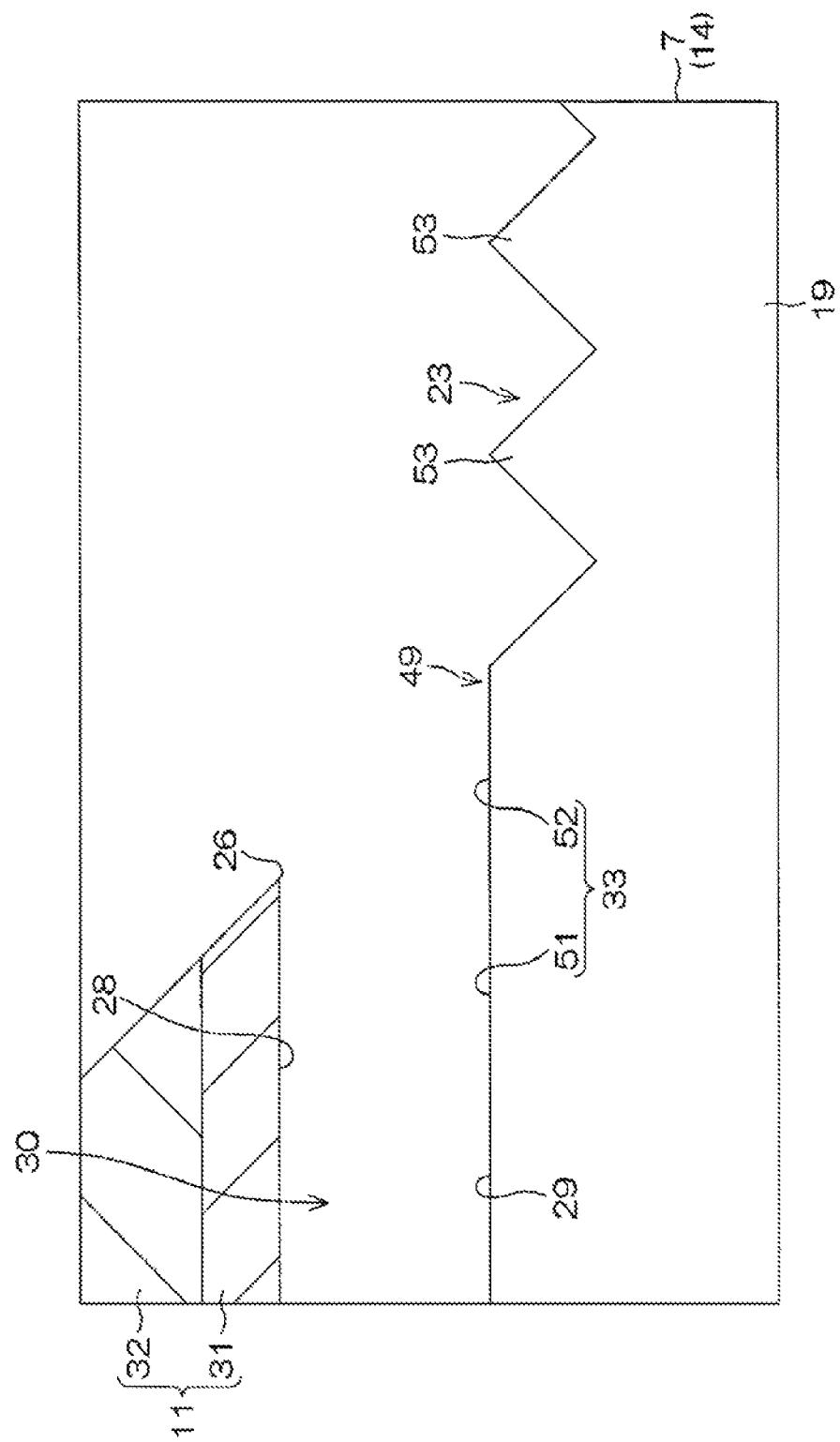

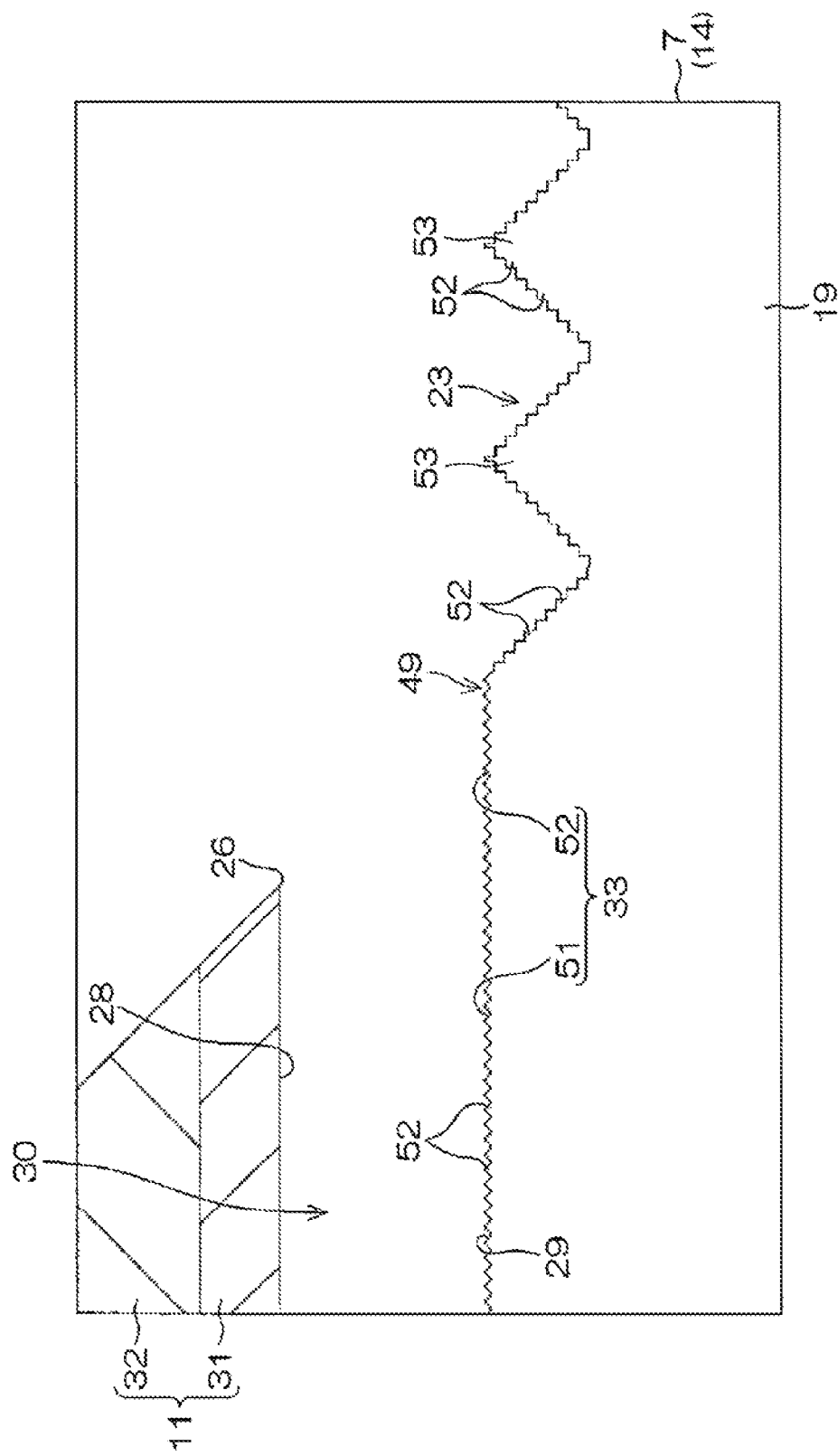

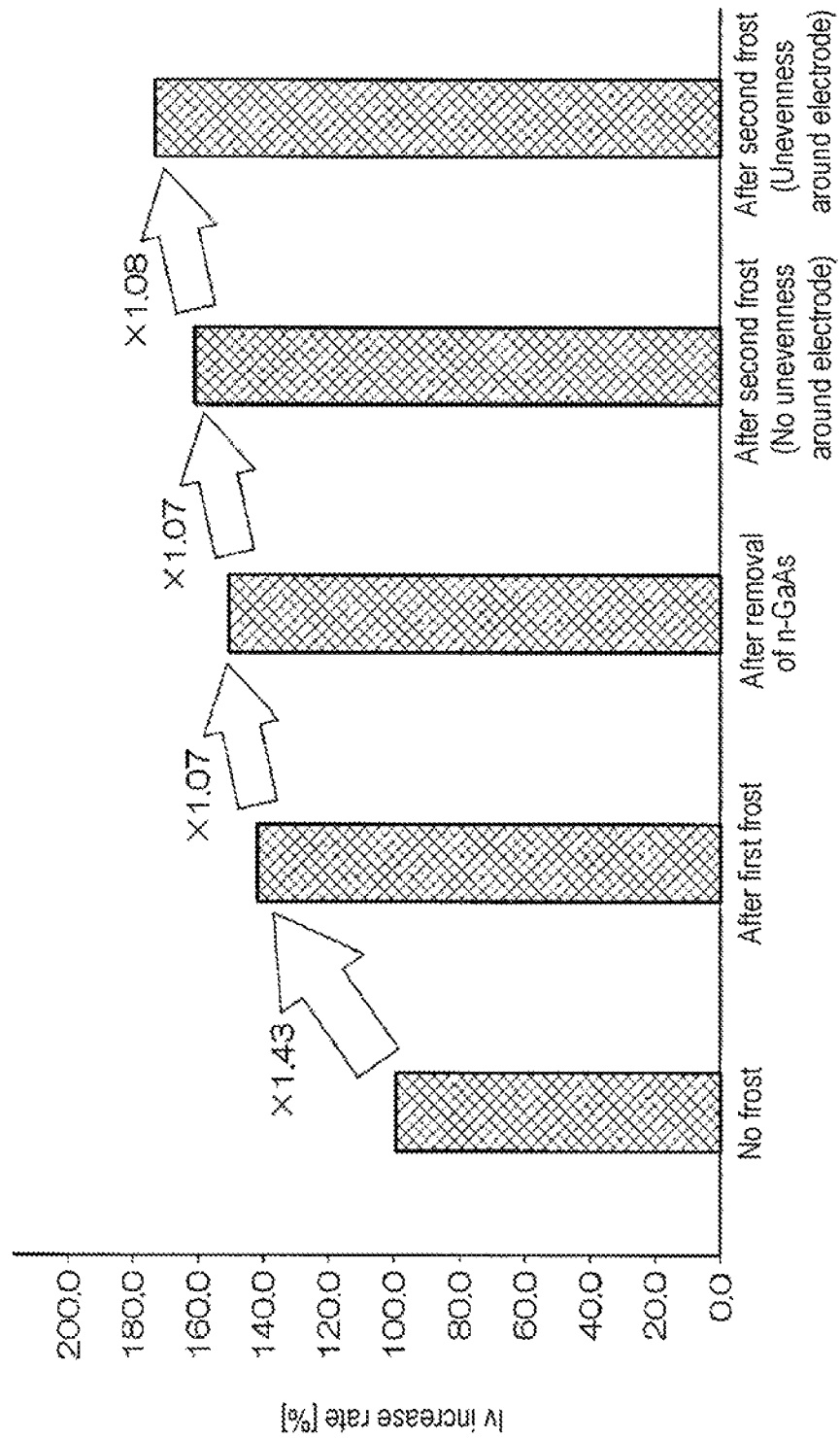

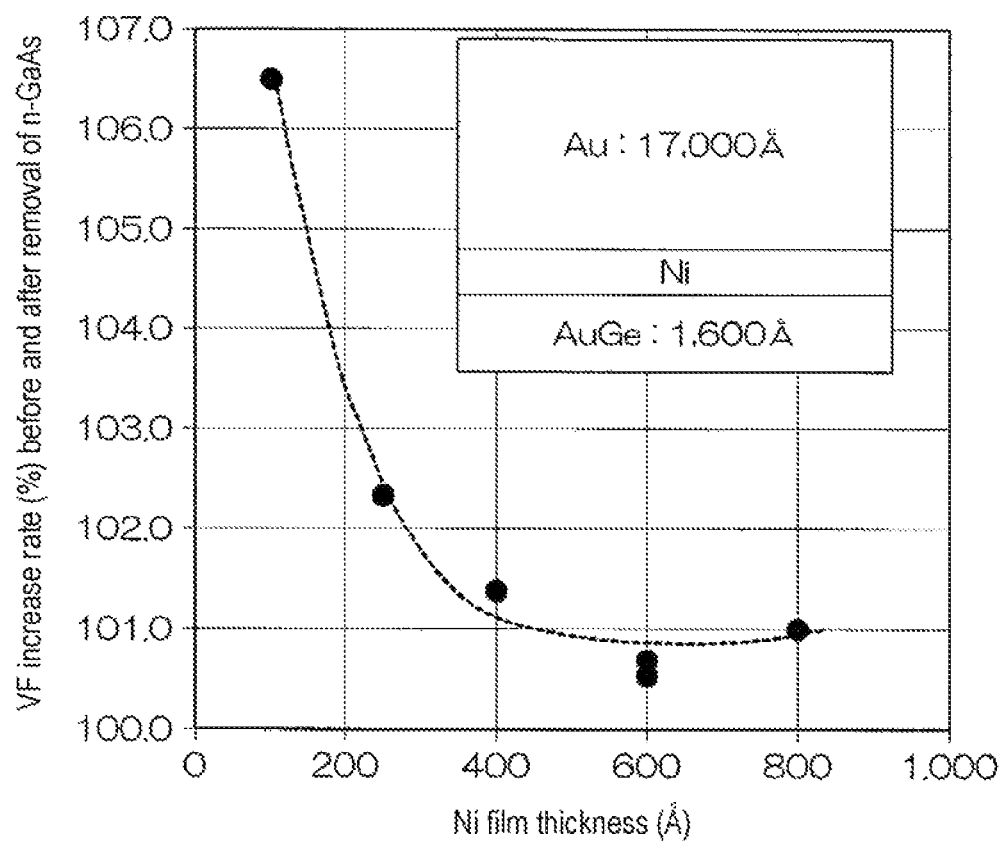

SEMICONDUCTOR LIGHT EMITTING DEVICE AND METHOD FOR MANUFACTURING SEMICONDUCTOR LIGHT EMITTING DEVICE

CROSS-REFERENCE TO RELATED APPLICATIONS

This application is a division of U.S. application Ser. No. 16/597,453, filed on Oct. 9, 2019, which is based upon and claims the benefit of priority from Japanese Patent Application No. 2018-193531, filed on Oct. 12, 2018, and Japanese Patent Application No. 2019-131237, filed on Jul. 16, 2019, the entire contents of which are incorporated herein by reference.

TECHNICAL FIELD

The present disclosure relates to a semiconductor light emitting device and a method for manufacturing a semiconductor light emitting device.

BACKGROUND

There is known a semiconductor light emitting element. This semiconductor light emitting device has a structure in which a non-light emitting portion and a light emitting portion are bonded by a first bonding metal layer and a second bonding metal layer. The non-light emitting portion includes a silicon substrate and a second bonding metal layer that covers the silicon substrate. The light emitting portion includes a semiconductor region that generates light, a light transmission layer that covers a main surface of the semiconductor region, a light reflection layer that covers the light transmission layer, and a first bonding metal layer that covers the light reflection layer.

The light emitting portion is disposed over the light emitting portion in such a posture that the main surface of the semiconductor region is opposed to the main surface of the silicon substrate related to the non-light emitting portion. In this state, the first bonding metal layer related to the light emitting portion is bonded to the second bonding metal layer related to the non-light emitting portion.

In the semiconductor light emitting device mentioned above, the light generated in an active layer passes through first, second and third auxiliary layers and is emitted to the cathode electrode side. Therefore, it is preferable that the material of the first, second and third auxiliary layers is a material having a composition that does not absorb the light generated in the active layer. However, the third auxiliary layer is an ohmic contact layer for the cathode electrode. Therefore, the material of the third auxiliary layer is limited to a material that is excellent in ohmic characteristics with the cathode electrode. On the other hand, even when processing the third auxiliary layer to improve the light extraction efficiency, it is desirable to avoid an increase in the forward voltage (VF) of the element as far as possible.

SUMMARY

Some embodiments of the present disclosure provide a semiconductor light emitting device and a method for manufacturing a semiconductor light emitting device, which are capable of improving light extraction efficiency while suppressing an increase in forward voltage (VF) for causing light emission in a light-emitting layer.

According to one embodiment of the present disclosure, there is provided a semiconductor light emitting device, including: a first electrode; a substrate formed over the first electrode; a metal layer formed over the substrate; a semiconductor layer formed over the metal layer and including a light-emitting layer, a first conductivity type layer disposed at a substrate side with respect to the light-emitting layer and a second conductivity type layer disposed at an opposite side to the substrate with respect to the light-emitting layer; and a second electrode formed over the second conductivity type layer, wherein the second conductivity type layer includes a first layer at a portion connected to the second electrode, wherein the first layer includes an end portion below the second electrode, and wherein a space is formed between the end portion of the first layer and a peripheral edge of the second electrode.

Further, according to one embodiment of the present disclosure, there is provided a method for manufacturing a semiconductor light emitting device, including: forming a semiconductor structure including a substrate, a metal layer formed over the substrate, and a semiconductor layer that is formed over the metal layer and includes a light-emitting layer, a first conductivity type layer disposed at a substrate side with respect to the light-emitting layer and a second conductivity type layer disposed at an opposite side to the substrate with respect to the light-emitting layer, the second conductivity type layer including a first layer configured to form a surface of the semiconductor layer and a second layer disposed at the substrate side with respect to the first layer; exposing a surface of the second layer by selectively removing the first layer; forming an uneven portion at the surface of the second layer by performing a frost process on the exposed surface of the second layer; forming, after the act of forming the uneven portion, a second electrode over the first layer; forming a space between an end portion of the first layer and a peripheral edge of the second electrode by side-etching the first layer toward a lower side of the second electrode using a nitric acid-based dilute solution; and forming a first electrode below the substrate.

In this semiconductor light emitting device, the light generated in the light-emitting layer passes directly through the second conductivity type layer and is extracted to the second electrode side. The light is reflected by the metal layer. The light passes through the first conductivity type layer and the second conductivity type layer and is extracted to the second electrode side. The first layer of the second conductivity type layer has an end portion below the second electrode. A space is formed between the end portion of the first layer and a peripheral edge of the second electrode. Thus, the entirety or a part of the first layer does not protrude from the second electrode. Therefore, even if the first layer is composed of a composition that absorbs the light generated in the light-emitting layer, the range that inhibits (reflects or absorbs) light on the second electrode side can be limited to the formation region of the second electrode. As a result, it is possible to improve the light extraction efficiency of the semiconductor light emitting device.

On the other hand, the contact area with the second electrode is reduced as compared with the case where the entire first layer makes contact with the second electrode. Therefore, there is a concern that the forward voltage (VF) increases. However, if the space below the second electrode is formed by side etching using a dilute nitric acid solution as the method for manufacturing a semiconductor light emitting device, the etching amount can be kept relatively small. This makes it possible to suppress an increase in the forward voltage (VF) of the semiconductor light emitting device.

According to one embodiment of the present disclosure, in the semiconductor light emitting device, the second conductivity type layer may include a second layer disposed at the substrate side with respect to the first layer, and the second layer may include a surface including a flat portion that is formed at a portion facing the second electrode across the space and a first uneven portion that is formed at a region outside the second electrode. Further, according to one embodiment of the present disclosure, in the semiconductor light emitting device, the flat portion may be further formed at a peripheral portion of the second layer in the region outside the second electrode.

According to one embodiment of the present disclosure, in the semiconductor light emitting device, the second conductivity type layer may include a second layer disposed at the substrate side with respect to the first layer, the second layer may include a surface including a first uneven portion that is formed at a region outside the second electrode and has a first roughness, and the surface of the second layer may further include a second uneven portion that is formed at a portion facing the second electrode across the space and at a surface of each convex portion of the first uneven portion and has a second roughness smaller than the first roughness.

According to this configuration, the luminous intensity of the semiconductor light emitting device can be increased by forming the second uneven portion. According to one embodiment of the present disclosure, in the semiconductor light emitting device, the second uneven portion may be further formed at a peripheral portion of the second layer in the region outside the second electrode. According to one embodiment of the present disclosure, in the semiconductor light emitting device, an arithmetic mean roughness Ra of the first uneven portion may be 0.1 µm to 0.5 µm, and an arithmetic mean roughness Ra of the second uneven portion may be 0.01 µm to 0.1 µm.

According to one embodiment of the present disclosure, in the semiconductor light emitting device, a width W1 of the peripheral portion from a portion of the second layer facing the peripheral edge of the second electrode may be 1 µm to 3 µm. According to one embodiment of the present disclosure, in the semiconductor light emitting device, the second electrode may include a pad electrode portion to which a bonding member is connected, and a branch electrode portion extending in a branch shape from the pad electrode portion, the space may formed below the branch electrode portion, and a width W2 of the space from a peripheral edge of the branch electrode portion may be shorter than ½ of a width W3 of the branch electrode portion.

According to one embodiment of the present disclosure, in the semiconductor light emitting device, the width W3 of the branch electrode portion may be 6 µm to 8 µm, and the width W2 of the space may be 1 µm to 2 µm. According to one embodiment of the present disclosure, in the semiconductor light emitting device, the first layer of the second conductivity type layer may include an n-type GaAs contact layer. According to one embodiment of the present disclosure, the semiconductor light emitting device may further include a light-transmitting conductive layer formed between the metal layer and the semiconductor layer.

According to one embodiment of the present disclosure, in the semiconductor light emitting device, the light-transmitting conductive layer may include ITO (indium tin oxide), ZnO (zinc oxide) or IZO (indium zinc oxide).

According to one embodiment of the present disclosure, the semiconductor light emitting device may further include an insulating layer formed between the metal layer and the semiconductor layer and selectively including a contact hole, wherein the metal layer is electrically connected to the first conductivity type layer through the contact hole.

According to one embodiment of the present disclosure, in the semiconductor light emitting device, the insulating layer may include $SiO_2$, SiN or $MgF_2$. According to one embodiment of the present disclosure, in the semiconductor light emitting device, the metal layer may include Au. According to one embodiment of the present disclosure, in the semiconductor light emitting device, the substrate may include a Si substrate.

According to one embodiment of the present disclosure, the method for manufacturing the semiconductor light emitting device may further include performing, after the act of forming the space, a frost process on a portion of the second layer facing the second electrode across the space and on the uneven portion using a dilute hydrochloric acid. According to one embodiment of the present disclosure, in the method for manufacturing the semiconductor light emitting device, the first layer of the second conductivity type layer may include an n-type GaAs contact layer, and the act of forming the second electrode may include: a first act of forming a layer containing Au and Ge by vaporizing a first vapor deposition material containing Au and Ge and depositing the first vapor deposition material on the n-type GaAs contact layer; and a second act of forming, after the first act, a layer containing Ni by vaporizing a second vapor deposition material containing Ni and depositing the second vapor deposition material on the layer containing Au and Ge.

The side-etching amount of the first layer can be suppressed by this method. As a result, a decrease in the contact area between the second electrode and the first layer (n-type GaAs contact layer) is suppressed. This makes it possible to suppress an increase in the forward voltage (VF). According to one embodiment of the present disclosure, in the method for manufacturing the semiconductor light emitting device, a weight ratio of Ni to a total amount of Au, Ge and Ni may be 20 wt % or larger.

According to one embodiment of the present disclosure, in the method for manufacturing the semiconductor light emitting device, the act of forming the semiconductor structure may include: forming the second conductivity type layer, the light-emitting layer, the first conductivity type layer and a first metal layer in this order over a first substrate; forming a second metal layer over a second substrate; attaching the first substrate and the second substrate to each other by bonding the first metal layer and the second metal layer to each other to form the metal layer; and removing, after the act of attaching, the first substrate.

BRIEF DESCRIPTION OF DRAWINGS

FIG. 5F is a view showing a step subsequent to the step of FIG. 5E.

FIG. 10E is a view showing a step subsequent to the step of FIG. 10D.

FIG. 10G is a view showing a step subsequent to the step of FIG. 10F.

FIG. 10I is a view showing a step subsequent to the step of FIG. 10H.

FIG. 13A is a view showing a step related to the formation of an uneven structure shown in FIG. 12.

FIG. 13B is a view showing a step subsequent to the step of FIG. 13A.

FIG. 15 is a view showing an Iv increase rate of the semiconductor light emitting device.

FIG. 18 is a view showing a relationship between a Ni film thickness and a VF increase rate.

DETAILED DESCRIPTION

Figure 1:
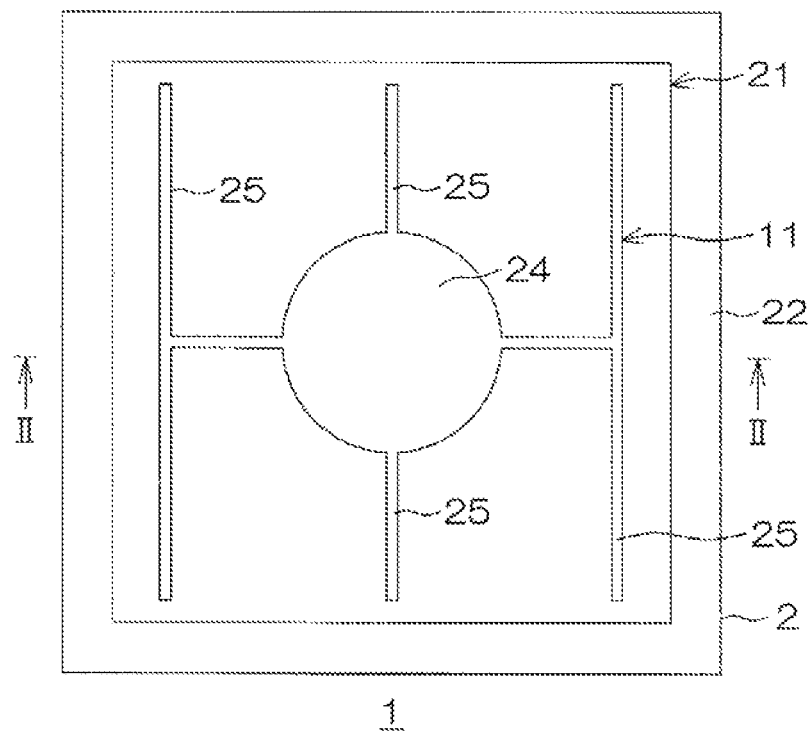
FIG. 1 is a plan view of a semiconductor light emitting device according to a first embodiment of the present disclosure.
Figure 2:
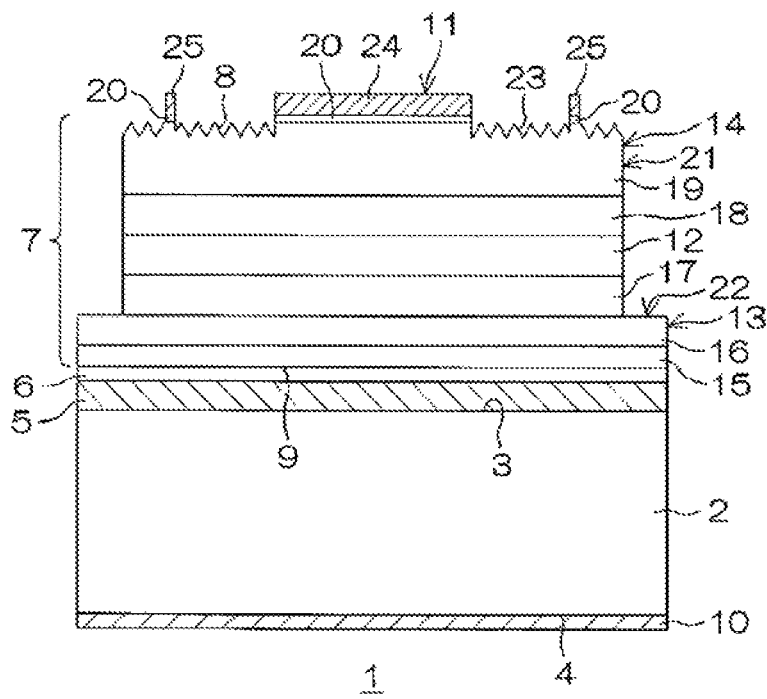
FIG. 2 is a sectional view of the semiconductor light emitting device according to the first embodiment of the present disclosure, which is taken along line II-II in FIG. 1.

Embodiments of the present disclosure will be now described in detail with reference to the drawings. FIG. 1 is a plan view of a semiconductor light emitting device according to a first embodiment of the present disclosure. FIG. 2 is a sectional view of the semiconductor light emitting device according to the first embodiment of the present disclosure, which is taken along line II-II in FIG. 1. The semiconductor light emitting device 1 includes a substrate 2 having a first surface 3 and a second surface 4, a metal layer 5 formed over the substrate 2, a light-transmitting conductive layer 6 formed over the metal layer 5, a compound semiconductor layer 7 as an example of a semiconductor layer of the present disclosure formed over the light-transmitting conductive layer 6 and having a first surface 8 and a second surface 9, an anode electrode layer 10 as an example of a first electrode of the present disclosure formed so as to make contact with the second surface 4 of the substrate 2, and a cathode electrode layer 11 as an example of a second electrode of the present disclosure formed so as to make contact with the first surface 8 of the compound semiconductor layer 7.

The first surface 3 and the second surface 4 of the substrate 2 and the first surface 8 and the second surface 9 of the compound semiconductor layer 7 may be referred to as a front surface and a back surface of the substrate 2 and a front surface and a back surface of the compound semiconductor layer 7, respectively. The substrate 2 may include a conductor substrate made of a metallic material. The conductor substrate may contain at least one selected from the group of Al (aluminum), Cu (copper), Au (gold) and Ag (silver) as a metallic material.

The substrate 2 may include a semiconductor substrate made of a semiconductor material instead of or in addition to the conductor substrate. The semiconductor substrate may contain at least one selected from the group of Si (silicon), silicon carbide (SiC), germanium (Ge), a compound semiconductor and a nitride semiconductor as a semiconductor material. Hereinafter, an example in which the substrate 2 is formed of a Si-made semiconductor substrate will be described.

Furthermore, in the present embodiment, the substrate 2 is formed in a substantially square shape in a plan view as shown in FIG. 1. However, the plan-view shape of the substrate 2 is not particularly limited and may be, for example, a rectangular shape in a plan view. Moreover, the thickness of the substrate 2 may be, for example, 50 µm to 300 µm. In the present embodiment, the metal layer 5 is made of Au or an alloy containing Au. The metal layer 5 may be a single layer of each of an Au layer and an Au alloy layer, or may be a layer obtained by stacking these layers and other metal layers. When the metal layer 5 has a stacked layer structure, it is preferable that at least the surface of the metal layer 5 making contact with the light-transmitting conductive layer 6 is composed of an Au layer or an Au alloy layer (e.g., an AuBeNi layer). As an example, the metal layer 5 may have a stacked layer structure represented by (light-transmitting conductive layer 6 side) Au/Ti (substrate 2 side). Furthermore, the metal layer 5 may be configured such that a clear boundary is not formed between a plurality of metallic materials constituting the metal layer 5 and the metallic materials are sequentially distributed from, for example, the side of the substrate 2. On the other hand, in the present embodiment, as will be described below, the metal layer 5 is formed by bonding a first metal layer 37 (described below) and a second metal layer 38 (described below) by virtue of the bonding of a growth substrate 35 (described below) and the substrate 2. Accordingly, a boundary (bonding surface) between the first metal layer 37 and the second metal layer 38 may exist in the middle of the Au layer constituting the metal layer 5 in the thickness direction.

Furthermore, the metal layer 5 is formed so as to cover the entire first surface 3 of the substrate 2. Moreover, the (total) thickness of the metal layer 5 may be, for example, 0.1 µm to 3.0 µm. The light-transmitting conductive layer 6 may be any material that is transparent to the light emission wavelength of the light-emitting layer 12 described below. For example, the light-transmitting conductive layer 6 is made of ITO (indium tin oxide), ZnO (zinc oxide) or IZO (indium zinc oxide).

Moreover, the light-transmitting conductive layer 6 is formed so as to cover the entire surface of the metal layer 5. Furthermore, the (total) thickness of the light-transmitting conductive layer 6 may be, for example, 0.05 µm to 0.5 µm. In the present embodiment, the compound semiconductor layer 7 is an epitaxial layer formed by an epitaxial growth method. Specifically, the compound semiconductor layer 7 includes a light-emitting layer 12, a p-type semiconductor layer 13, and an n-type semiconductor layer 14. The p-type semiconductor layer 13 is disposed at the side of the substrate 2 with respect to the light-emitting layer 12, and the n-type semiconductor layer 14 is disposed at the side of the cathode electrode layer 11 with respect to the light-emitting layer 12. Thus, the light-emitting layer 12 is sandwiched between the p-type semiconductor layer 13 and the n-type semiconductor layer 14 to form a double-heterojunction. Electrons are injected into the light-emitting layer 12 from the n-type semiconductor layer 14 and holes are injected into the light-emitting layer 12 from the p-type semiconductor layer 13. As the electrons and the holes are recombined in the light-emitting layer 12, light is generated.

The p-type semiconductor layer 13 is formed by stacking a p-type contact layer 15 (having a thickness of, e.g., 0.1 µm to 2.5 µm), a p-type window layer 16 (having a thickness of, e.g., 0.1 µm to 2.5 µm) and a p-type cladding layer 17 (having a thickness of, e.g., 0.1 µm to 2.5 µm) sequentially from the side of the substrate 2. On the other hand, the n-type semiconductor layer 14 is formed by stacking an n-type cladding layer 18 (having a thickness of, e.g., 0.1 µm to 2.5 µm), an n-type window layer 19 (having a thickness of, e.g., 2.0 µm to 5.0 µm) as an example of the second layer of the present disclosure and an n-type contact layer 20 (having a thickness of, e.g., 0.1 µm to 2.5 µm) as an example of the first layer of the present disclosure sequentially on the light-emitting layer 12.

The p-type contact layer 15 and the n-type contact layer 20 are low resistance layers for making ohmic contact with the light-transmitting conductive layer 6 and the cathode electrode layer 11, respectively. The p-type contact layer 15 may be formed as a p-type semiconductor layer by doping GaP with, for example, C (carbon) as a p-type dopant at a high concentration. Furthermore, the n-type contact layer 20 may be formed as an n-type semiconductor layer by doping GaAs with, for example, Si as an n-type dopant at a high concentration.

The p-type window layer 16 may be formed as a p-type semiconductor by doping GaP with, for example, Mg as a p-type dopant. On the other hand, the n-type window layer 19 may be formed as an n-type semiconductor layer by doping AlInGaP with, for example, Si as an n-type dopant. The p-type cladding layer 17 may be formed as a p-type semiconductor layer by doping AlInP with, for example, Mg as a p-type dopant. On the other hand, the n-type cladding layer 18 may be formed as an n-type semiconductor layer by doping AlInP with Si as an n-type dopant.

The light-emitting layer 12 has, for example, an MQW (multiple-quantum-well) structure containing InGaP and is a layer for amplifying the light generated by recombination of electrons and holes. In the present embodiment, the light-emitting layer 12 has a MQW (multiple-quantum-well) structure formed by alternately and repeatedly stacking a quantum well layer (having a thickness of, e.g., 5 nm), which is made of an InGaP layer, and a barrier layer (having a thickness, e.g., 4 nm), which is made of an AlInGaP layer, in a plurality of periods. In this case, the quantum well layer made of InGaP has a relatively small band gap as the In composition ratio becomes 5% or larger, and the barrier layer made of AlInGaP has a relatively large band gap. For example, the quantum well layer (InGaP) and the barrier layer (AlInGaP) are alternately and repeatedly stacked in 10 to 40 periods, thereby forming a light-emitting layer 12 having a multiple-quantum-well structure. The light emission wavelength corresponds to the band gap of the quantum well layer, and the band gap can be adjusted by adjusting the In composition ratio. As the In composition ratio increases, the band gap decreases and the light emission wavelength increases. In the present embodiment, the light emission wavelength is set to 610 nm to 680 nm (e.g., 625 nm) by adjusting the IN composition in the quantum well layer (InGaP layer).

As shown in FIGS. 1 and 2, the compound semiconductor layer 7 is partially removed to form a mesa portion 21. More specifically, the n-type semiconductor layer 14, the light-emitting layer 12 and the p-type semiconductor layer 13 are partially etched away from the first surface 8 of the compound semiconductor layer 7 over the entire circumference of the compound semiconductor layer 7, thereby forming a mesa portion 21 having a substantially rectangular shape in cross section. The shape of the mesa portion 21 is not limited to a substantially rectangular shape in cross section and may be, for example, a trapezoidal shape. As a result, the p-type window layer 16 of the p-type semiconductor layer 13 and the layer closer to the substrate 2 than the p-type window layer 16 constitute a lead-out portion 22 that is led out from the mesa portion 21 in the lateral direction. As shown in FIG. 1, the mesa portion 21 is surrounded by the lead-out portion 22 in a plan view.

In the present embodiment, an uneven portion (a first uneven portion) 23 is formed at the surface of the mesa portion 21. The light extracted from the compound semiconductor layer 7 can be diffused by the uneven portion 23. In the present embodiment, as will be described below, the n-type contact layer 20 is selectively removed in conformity with the shape of the cathode electrode layer 11 so that the n-type window layer 19 is exposed. The uneven portion 23 is formed at the exposed surface. In FIG. 1, the uneven portion 23 is omitted for clarity.

In the present embodiment, the anode electrode layer 10 as a back surface electrode is made of Au or an alloy containing Au. Specifically, the anode electrode layer 10 may have a stacked layer structure represented by (substrate 2 side) Ti/Au. Furthermore, the anode electrode layer 10 is formed so as to cover the entire second surface 4 of the substrate 2. In the present embodiment, the cathode electrode layer 11 as a front surface electrode is made of Au or an alloy containing Au. Specifically, the cathode electrode layer 11 may have a stacked layer structure represented by (compound semiconductor layer 7 side) AuGeNi/Au.

In addition, the cathode electrode layer 11 integrally includes a pad electrode portion 24 and branch electrode portions 25 that selectively extend from the pad electrode portion 24 in a branch shape so as to partition certain regions around the pad electrode portion 24. In the present embodiment, the pad electrode portion 24 is disposed substantially at the center of the mesa portion 21 in a plan view. The branch electrode portions 25 include branch electrode portions 25 extending in a cross shape from the pad electrode portion 24 toward the respective peripheral edges of the mesa portion 21, and branch electrode portions 25 intersecting the cross-shaped branch electrode portions 25 and extending along the respective peripheral edges of the mesa portion 21. In the present embodiment, since the n-type contact layer 20 has substantially the same shape as the cathode electrode layer 11, the n-type window layer 19 is exposed from a region other than the region where the cathode electrode layer 11 is formed.

Figure 3A:
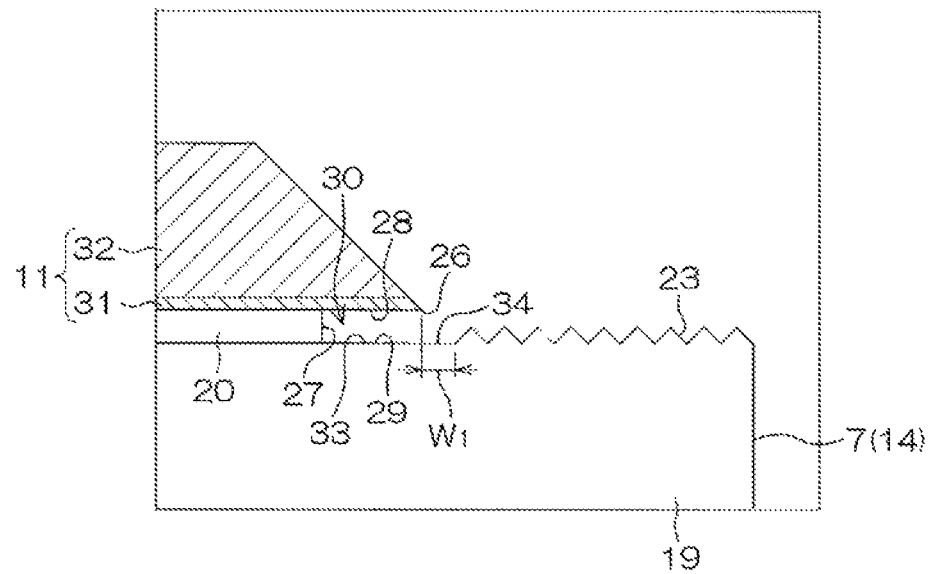
FIG. 3A is an enlarged view of a main part of the semiconductor light emitting device shown in FIG. 2.
Figure 3B:
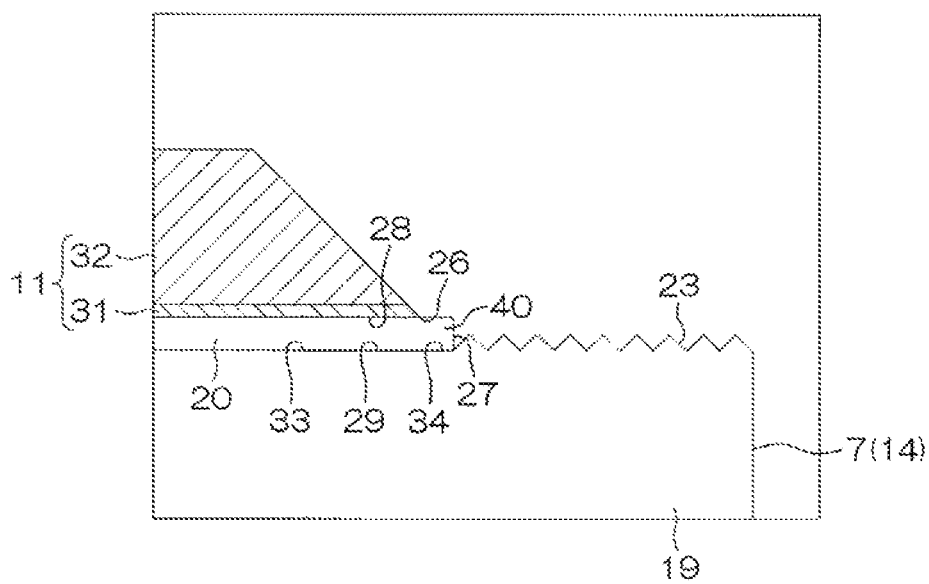
FIG. 3B is a reference view for comparison with the structure of FIG. 3A.
Figure 4A:
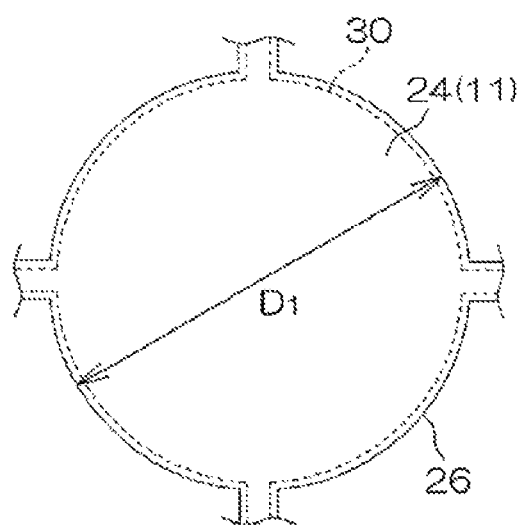
FIG. 4A is an enlarged view of a main part of the semiconductor light emitting device shown in FIG. 1.
Figure 4B:
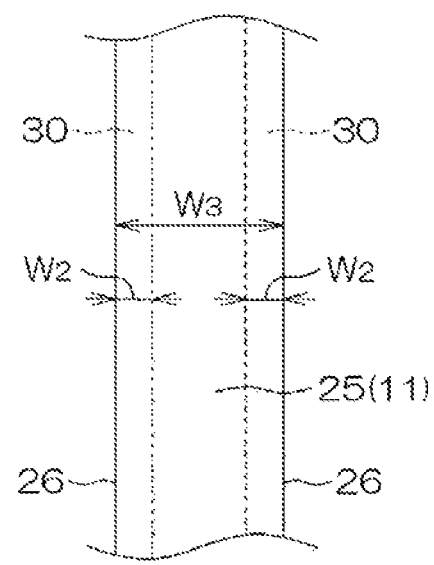
FIG. 4B is an enlarged view of a main part of the semiconductor light emitting device shown in FIG. 1.

FIG. 3A is an enlarged view of a main part of the semiconductor light emitting device shown in FIG. 2. FIG. 3B is a reference view for comparison with the structure of FIG. 3A. FIG. 4A is an enlarged view of a main part of the semiconductor light emitting device shown in FIG. 1. FIG. 4B is an enlarged view of a main part of the semiconductor light emitting device shown in FIG. 1. Next, a more detailed structure of the n-type semiconductor layer 14 and the cathode electrode layer 11 will be described with reference to FIGS. 3A, 3B, 4A and 4B.

As shown in FIGS. 1 and 2, the n-type contact layer 20 has substantially the same shape as the cathode electrode layer 11. More specifically, the n-type contact layer 20 has an end portion 27 formed below the cathode electrode layer 11. The n-type contact layer 20 is formed to be slightly smaller than the cathode electrode layer 11 in a plan view. Accordingly, a space 30 defined by the lower surface 28 of the cathode electrode layer 11, the end portion 27 of the n-type contact layer 20 and the upper surface 29 of the n-type window layer 19 is formed between the end portion 27 of the n-type contact layer 20 and a peripheral edge 26 of the cathode electrode layer 11.

For example, as shown in FIG. 3A, when the cathode electrode layer 11 is formed in a trapezoidal shape with the width thereof growing smaller upward in cross section, the peripheral edge 26 of the cathode electrode layer 11 may be the edge of the lower end of the cathode electrode layer 11. Furthermore, as described above, the cathode electrode layer 11 may have a stacked layer structure of an AuGeNi layer 31 and an Au layer 32. The AuGeNi layer 31 may have a thickness of 1000 Å to 5000 Å, and the Au layer 32 may have a thickness of 17000 Å.

The space 30 below the cathode electrode layer 11 is continuously formed along the entire peripheral edge 26 of the cathode electrode layer 11 (the pad electrode portion 24 and the branch electrode portion 25) as shown in FIGS. 4A and 4B. More specifically, in the pad electrode portion 24, a circular space 30 may be formed along the entire circumference of the circular peripheral edge 26 of the pad electrode portion 24 having a circular shape in a plan view. Furthermore, in the branch electrode portions 25, the space 30 may be formed below both ends in the width direction of the branch electrode portions 25 along the longitudinal direction of the linear peripheral edges 26 of the branch electrode portions 25.

In the present embodiment, the width W2 of the spaces 30 extending from the peripheral edges 26 of the branch electrode portion 25 (the total width of the two spaces 30 formed at both ends in the width direction of the branch electrode portion 25) is preferably shorter than ½ of the width W3 of the branch electrode portion 25. More specifically, the width W3 of the branch electrode portion 25 may be 6 μm to 8 μm, and the width W2 of the spaces 30 may be 1 μm to 2 μm. In this way, a relatively large contact area between the cathode electrode layer 11 and the n-type contact layer 20 can be secured even in the branch electrode portion 25 which is thinner than the pad electrode portion 24 (having a diameter D1 of, e.g., 80 μm to 100 μm). Therefore, it is possible to suppress an increase in the forward voltage (VF) of the semiconductor light emitting device 1.

Furthermore, the n-type window layer 19 includes, in addition to the above-described uneven portion 23, a flat portion 33 which is not uneven or which is smoother than the uneven portion 23. The flat portion 33 is provided on the upper surface 29 of the n-type window layer 19. The flat portion 33 is formed at the space 30 below the cathode electrode layer 11 (i.e., the upper surface 29 of the n-type window layer 19 facing the cathode electrode layer 11 across the space 30) and in the peripheral portion 34 of the n-type window layer 19 in the region outside the cathode electrode layer 11.

The peripheral portion 34 of the n-type window layer 19 may be a region which is covered with the n-type contact layer 20 before the below-described side-etching process around the cathode electrode layer 11 (see FIG. 6B) and which is exposed after the side-etching process (see FIG. 6C). For example, the width W1 of the peripheral portion 34 extending from the portion of the n-type window layer 19 facing the peripheral edge 26 of the cathode electrode layer 11 may be 1 μm to 3 μm. FIGS. 5A to 5I are views showing a process of manufacturing the semiconductor light emitting device 1 shown in FIGS. 1 and 2 in the order of steps.

Figure 6A:
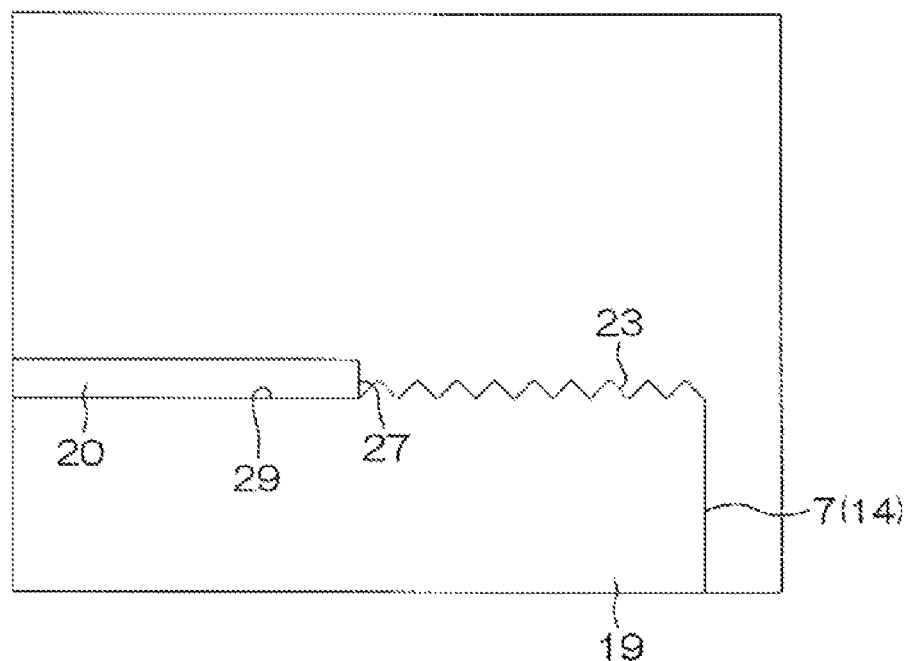
FIG. 6A is a diagram showing a part of a step related to side etching of an n-type contact layer.
Figure 6B:
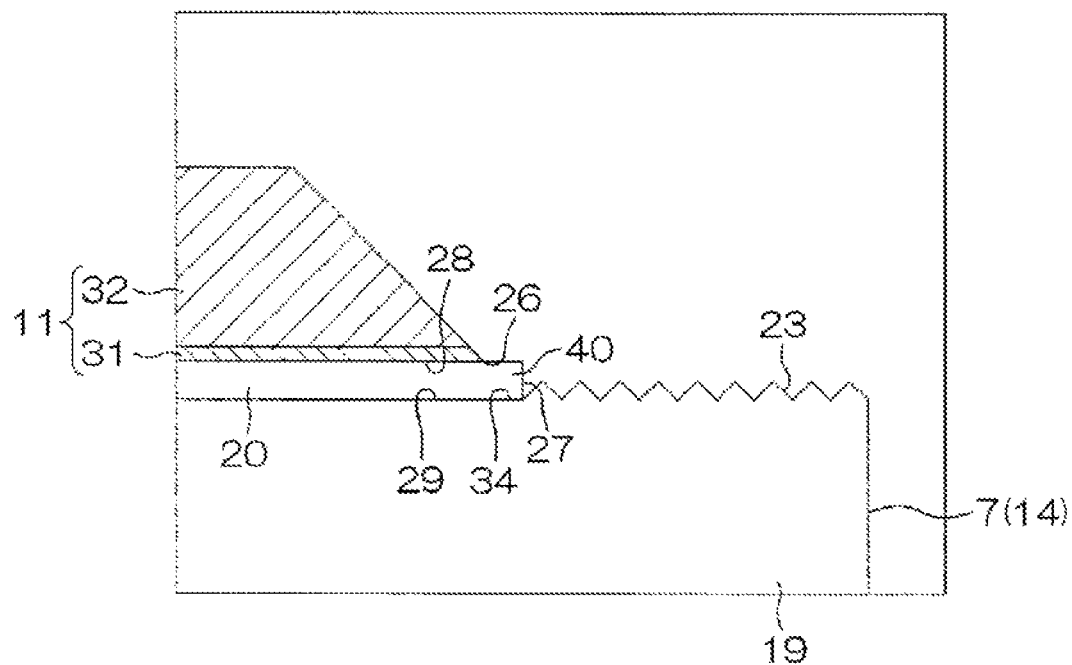
FIG. 6B is a view showing a step subsequent to the step of FIG. 6A.
Figure 6C:
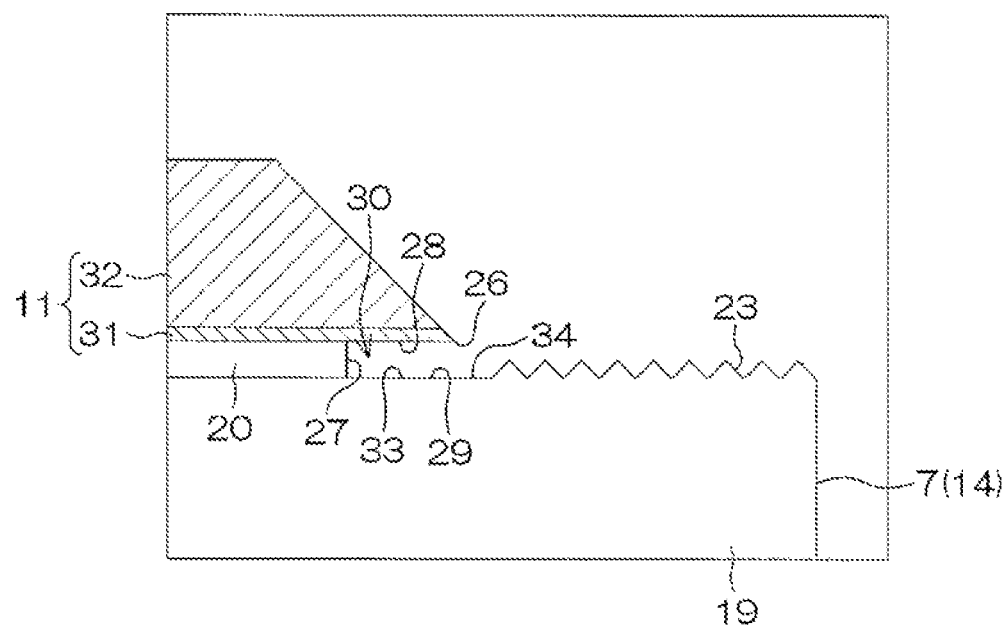
FIG. 6C is a view showing a step subsequent to the step of FIG. 6B.

Furthermore, FIGS. 6A to 6C are views showing the steps related to the side etching of the n-type contact layer 20.

Figure 5A:
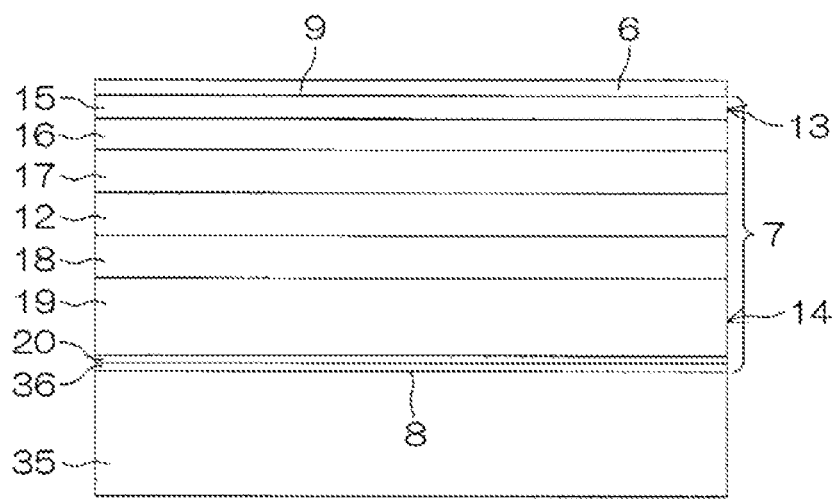
FIG. 5A is a view showing a step of a method for manufacturing the semiconductor light emitting device.

In order to manufacture the semiconductor light emitting device 1, for example, as shown in FIG. 5A, a compound semiconductor layer 7 is formed by epitaxial growth on the growth substrate 35 as an example of the first substrate of the present disclosure made of GaAs or the like. As the growth method, for example, a known growth method such as a molecular beam epitaxial growth method or an organic metal vapor phase growth method may be used. At this stage, the compound semiconductor layer 7 includes an n-type etching stop layer 36, an n-type contact layer 20, an n-type window layer 19, an n-type cladding layer 18, a light-emitting layer 12, a p-type cladding layer 17, a p-type window layer 16 and a p-type contact layer 15 sequentially formed from the side of the growth substrate 35. After the formation of the compound semiconductor layer 7, a light-transmitting conductive layer 6 is formed, for example, by vapor deposition.

Figure 5B:
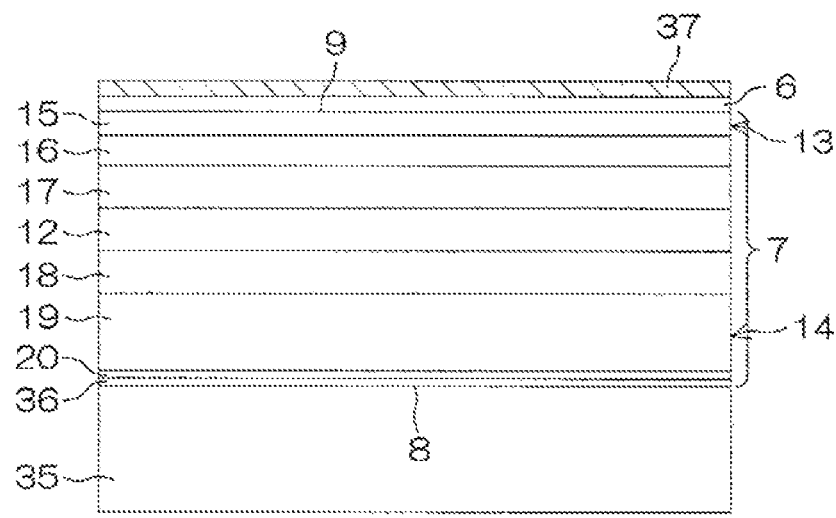
FIG. 5B is a view showing a step subsequent to the step of FIG. 5A.

Next, as shown in FIG. 5B, a first metal layer 37 (having a thickness of, e.g., 2.0 μm) is formed over the light-transmitting conductive layer 6 by, for example, vapor deposition. The first metal layer 37 is made of Au or an alloy containing Au. At least the outermost surface of the first metal layer 37 is formed of an Au layer. The next step is a step of attaching the growth substrate 35 and the substrate 2 to each other as an example of the second substrate of the present disclosure. In the attaching step, the first metal layer 37 on the growth substrate 35 and a second metal layer 38 on the substrate 2 are bonded. The second metal layer 38 is made of Au or an alloy containing Au. At least the outermost surface of the second metal layer 38 is formed of an Au layer. The second metal layer 38 is formed over the first surface 3 of the substrate 2 by, for example, vapor deposition, before the attaching thereof.

Figure 5C:
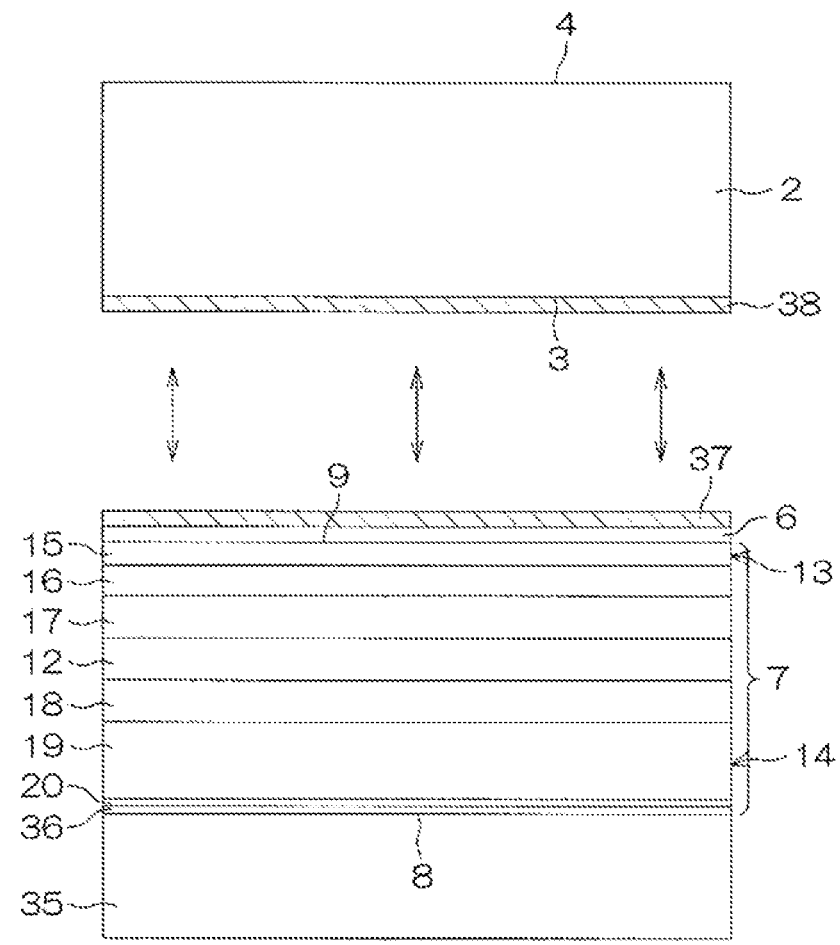
FIG. 5C is a view showing a step subsequent to the step of FIG. 5B.

More specifically, as shown in FIG. 5C, the growth substrate 35 and the substrate 2 are overlapped with each other in a state in which the first and second metal layers 37 and 38 face each other, whereby the first and second metal layers 37 and 38 are bonded. The bonding of the first and second metal layers 37 and 38 may be performed by, for example, thermal compression bonding. The thermal compression bonding conditions may be, for example, a temperature of 250 degrees C. to 350 degrees C. and a pressure of 30 kN to 45 kN. By this bonding, as shown in FIG. 5D, the first and second metal layers 37 and 38 are combined to form a metal layer 5.

Figure 5D:
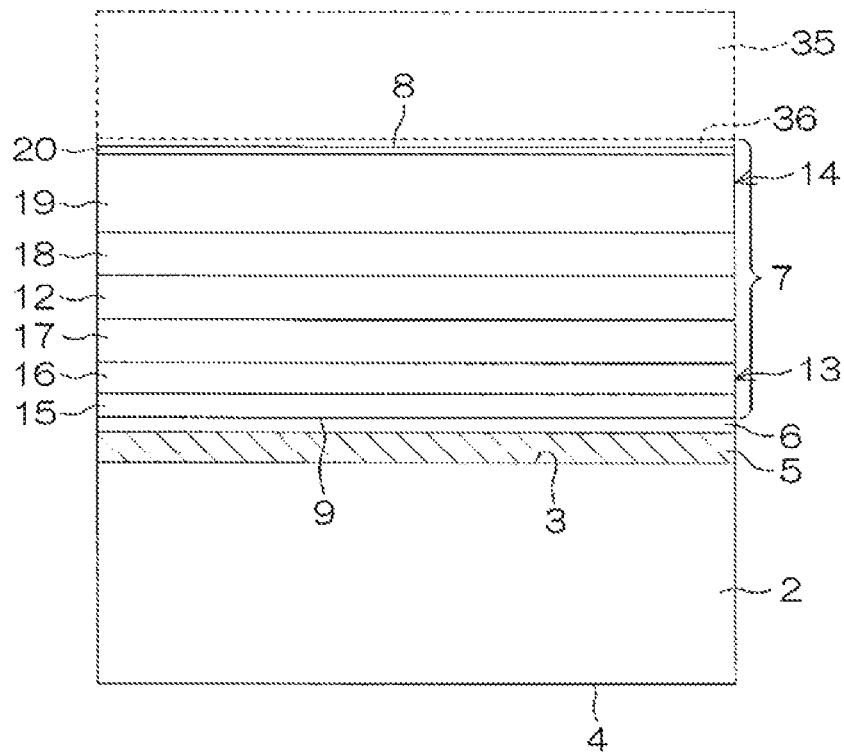
FIG. 5D is a view showing a step subsequent to the step of FIG. 5C.

Next, as shown in FIG. 5D, the growth substrate 35 is removed by, for example, wet etching. Since the n-type etching stop layer 36 is formed at the outermost surface of the compound semiconductor layer 7, the n-type contact layer 20 and the n-type window layer 19 that contribute to the characteristics of the semiconductor light emitting device 1 are not affected during the wet etching. Thereafter, the n-type etching stop layer 36 is also removed.

Figure 5E:
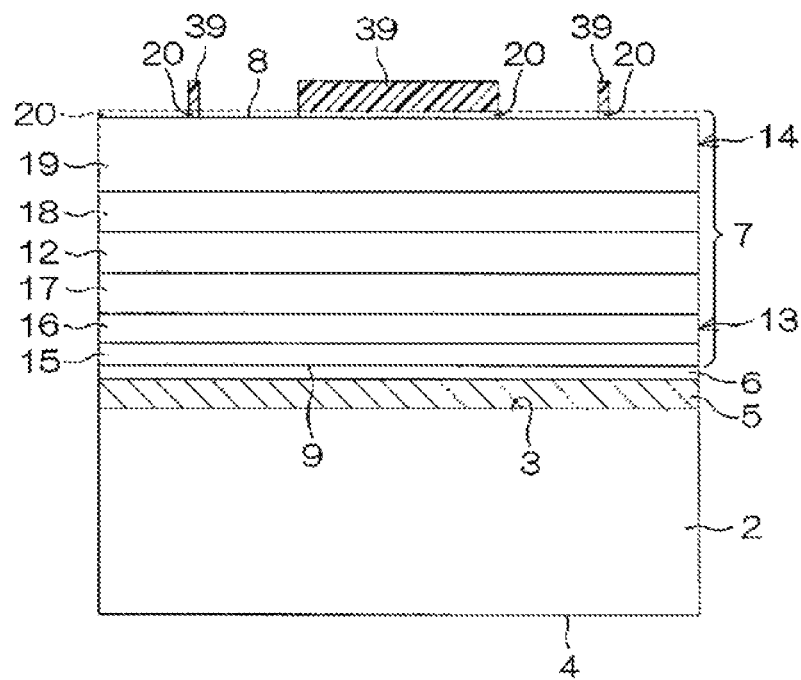
FIG. 5E is a view showing a step subsequent to the step of FIG. 5D.

The next steps are a step of processing unevenness on the n-type window layer 19, a step of forming a cathode electrode layer 11 and a step of side-etching the n-type contact layer 20. First, as shown in FIG. 5E, a resist 39 including openings having substantially the same pattern as the electrode pattern of the cathode electrode layer 11 is formed over the n-type contact layer 20. Thereafter, the n-type contact layer 20 exposed from the resist 39 is removed by etching. Thus, the n-type window layer 19 is exposed at portions other than the resist 39.

Next, as shown in FIG. 5F, an uneven portion 23 is formed at the surface of the n-type window layer 19 exposed from the resist 39 by, for example, a frost process (wet etching) or the like. The frost process may be performed by dry etching. Examples of the etching solution used include dilute hydrochloric acid. As a more specific product name, "Pure Etch150" manufactured by Hayashi Pure Chemical Industries, Ltd. may be used. Furthermore, the etching time may be, for example, 10 seconds to 100 seconds, preferably 50 seconds to 100 seconds. By continuing the etching for 50 seconds or longer, the uneven portion 23 can be satisfactorily formed. In addition, the etching temperature may be, for example, 30 degrees C. to 60 degrees C.

Thereafter, the resist 39 is removed. FIG. 6A is an enlarged view of a main part after the resist 39 is removed. Next, as shown in FIG. 6B, an AuGeNi layer 31 and an Au layer 32 are stacked on the n-type contact layer 20, thereby forming a cathode electrode layer 11. The cathode electrode layer 11 may be formed by, for example, a lift-off method.

Figure 5G:
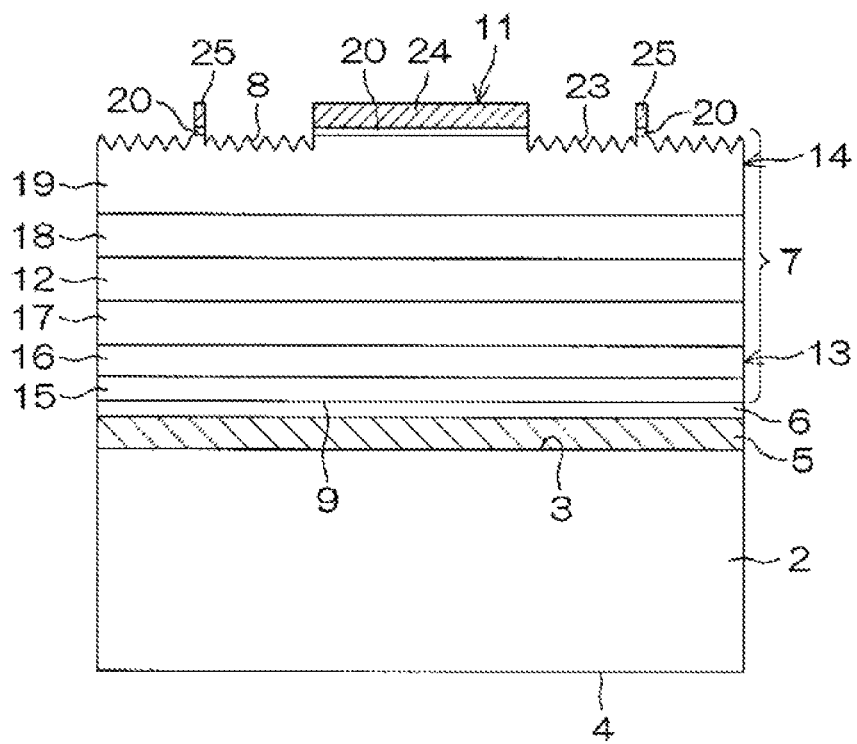
FIG. 5G is a view showing a step subsequent to the step of FIG. 5F.

In the lift-off method, although not shown, a resist including an opening having substantially the same pattern as the n-type contact layer 20 (more specifically, a resist including an opening slightly smaller than that of the n-type contact layer 20 in consideration of a slight misalignment of the resist) is formed over the compound semiconductor layer 7. Next, an electrode material film of the cathode electrode layer 11 is stacked on the compound semiconductor layer 7 by, for example, vapor deposition. Then, the electrode material film on the resist is removed together with the resist. Thus, as shown in FIGS. 5G and 6B, the cathode electrode layer 11 made of the electrode material film remaining on the n-type contact layer 20 is formed. At this time, the end portion 27 of the n-type contact layer 20 is disposed at the peripheral portion 34 outside the peripheral edge 26 of the cathode electrode layer 11. That is, as a result of using the resist in consideration of the misalignment, the n-type contact layer 20 has a portion 40 protruding outward from the cathode electrode layer 11.

Next, as shown in FIG. 6C, a space 30 is formed by side-etching the n-type contact layer 20 toward the lower side of the cathode electrode layer 11 through wet etching using a nitric acid-based dilute solution. Furthermore, the upper surface 29 of the n-type window layer 19 covered with the n-type contact layer 20 before the side etching is protected by the n-type contact layer 20 during the unevenness processing. Therefore, the upper surface 29 of the n-type window layer 19 is exposed as a flat portion 33.

Figure 5H:
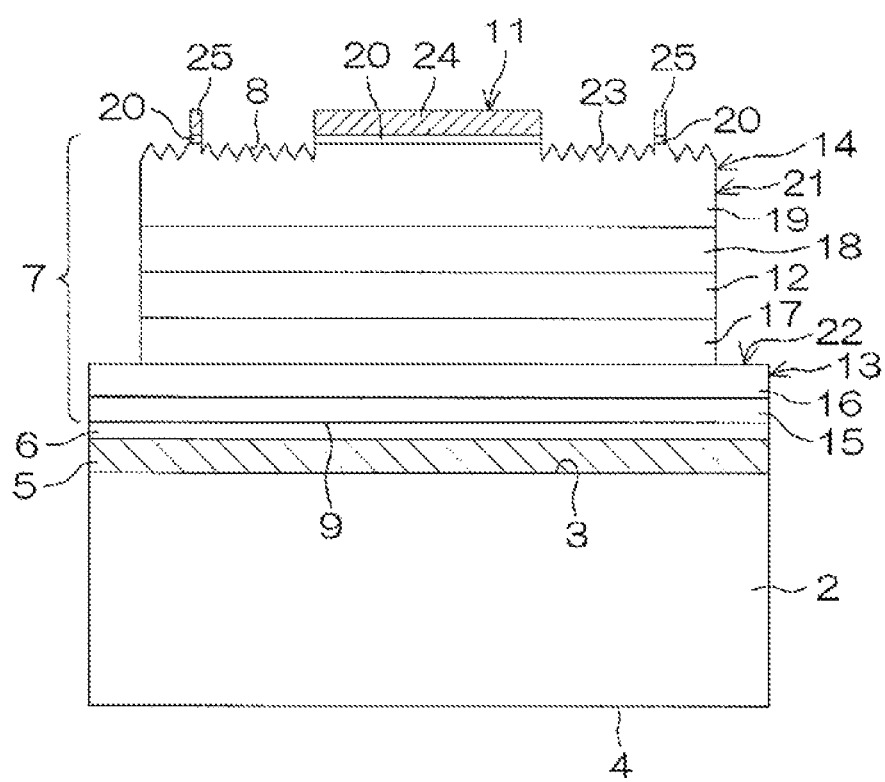
FIG. 5H is a view showing a step subsequent to the step of FIG. 5G.

The nitric acid-based dilute solution may be, for example, an etching solution containing smaller than 10% nitric acid. The etching time may be, for example, 10 seconds to 60 seconds, and the temperature may be, for example, 15 degrees C. to 25 degrees C. Next, as shown in FIG. 5H, a mesa portion 21 and a lead-out portion 22 are formed by selectively removing the peripheral edge portion of the compound semiconductor layer 7. The mesa portion 21 and the lead-out portion 22 may be formed by, for example, wet etching.

Figure 5I:
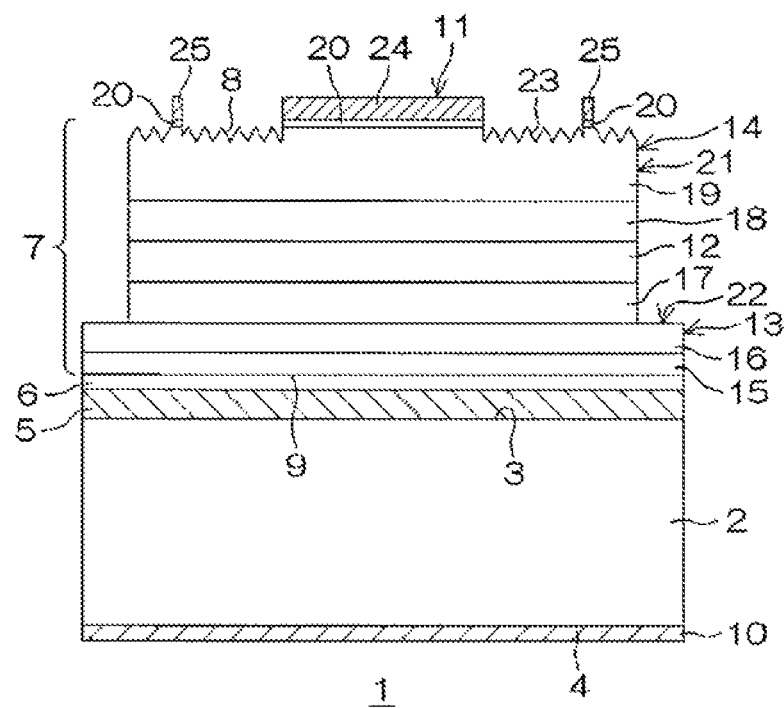
FIG. 5I is a view showing a step subsequent to the step of FIG. 5H.

Next, as shown in FIG. 5I, an anode electrode layer 10 is formed at the second surface 4 of the substrate 2 by, for example, vapor deposition. The semiconductor light emitting device 1 is obtained through the above steps. As described above, in the semiconductor light emitting device 1, the light generated in the light-emitting layer 12 passes directly through the n-type semiconductor layer 14 and is extracted to the side of the cathode electrode layer 11. The light is reflected by the metal layer 5. The light passes through the p-type semiconductor layer 13 and the n-type semiconductor layer 14 and is extracted to the side of the cathode electrode layer 11.

In the present embodiment, as shown in FIG. 3A, the n-type contact layer 20 of the n-type semiconductor layer 14 has the end portion 27 below the cathode electrode layer 11 than the peripheral edge 26 of the cathode electrode layer 11. The space 30 is formed between the end portion 27 of the n-type contact layer 20 and the peripheral edge 26 of the cathode electrode layer 11. Thus, the entirety or a part of the n-type contact layer 20 does not protrude from the cathode electrode layer 11.

Accordingly, even if the n-type contact layer 20 is composed of a composition such as GaAs or the like that absorbs the light (having a wavelength range of, e.g., 610 nm to 680 nm) generated in the light-emitting layer 12, the range that inhibits (reflects or absorbs) light on the side of the cathode electrode layer 11 can be limited to the formation region of the cathode electrode layer 11. As a result, it is possible to improve the light extraction efficiency of the semiconductor light emitting device 1.

On the other hand, in the reference example of FIG. 3B in which the side etching shown in FIG. 6C is not performed, the n-type contact layer 20 has a portion 40 protruding outside the cathode electrode layer 11. In this configuration, the emission of light is sometimes limited by the light absorption of the n-type contact layer 20 even in the peripheral portion 34 of the n-type window layer 19 as well as the cathode electrode layer 11 as a metal layer that originally inhibits the emission of light.

In addition, as compared with the case where the entire n-type contact layer 20 is in contact with the cathode electrode layer 11, the contact area of the n-type contact layer 20 with the cathode electrode layer 11 is reduced. Therefore, there is a concern that the forward voltage (VF) increases. However, if the space 30 below the cathode electrode layer 11 is formed by side etching using a nitric acid-based dilute solution as the method of manufacturing the semiconductor light emitting device 1 according to the present embodiment, the etching amount can be kept at a relatively small amount. Therefore, it is possible to suppress the increase in the forward voltage (VF) of the semiconductor light emitting device 1.

Figure 7:
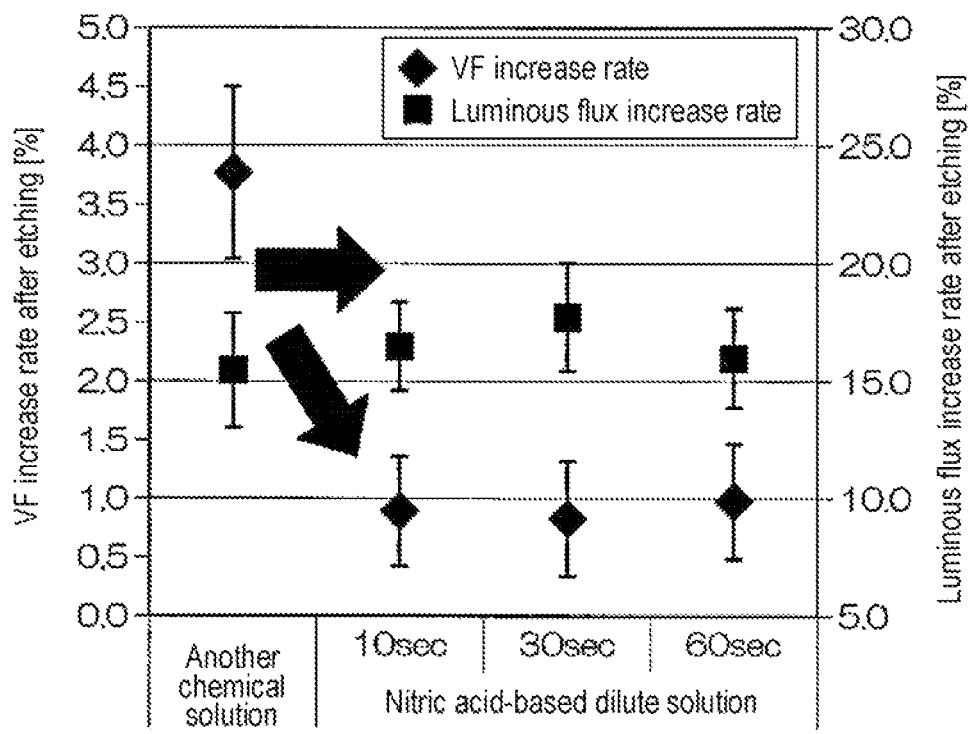
FIG. 7 is a view showing a relationship between an etching solution used for side etching of an n-type contact layer, an increase rate of a forward voltage (VF) and a luminous flux increase rate.

The effect of suppressing the increase in the forward voltage (VF) can be explained by, for example, FIG. 7. FIG. 7 shows a forward voltage (VF) increase rate and a luminous flux increase rate after performing the side-etching step shown in FIG. 6C with a nitric acid-based dilute solution (etching time: 10 seconds, 30 seconds and 60 seconds) and another chemical solution (sulfuric acid hydrogen peroxide). According to FIG. 7, when side etching is performed with another chemical solution, the luminous flux can be increased by about 15% as compared with the case where side etching is not performed. However, the forward voltage (VF) is increased by about 3.8%. On the other hand, when side etching is performed with a nitric acid-based dilute solution, the luminous flux can be increased by about 15% regardless of the etching time, and the forward voltage (VF) increase rate can be kept at about 1%.

Figure 8:
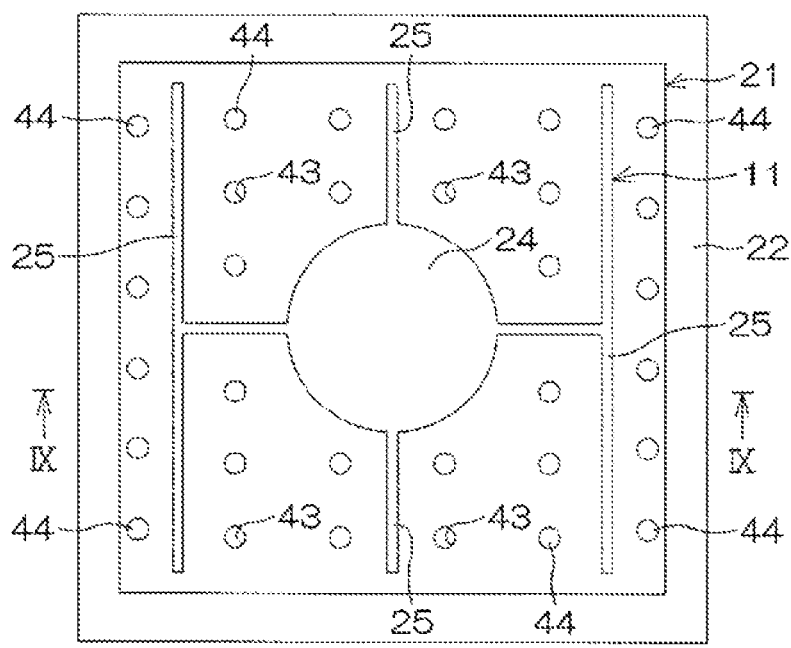
FIG. 8 is a plan view of a semiconductor light emitting device according to a second embodiment of the present disclosure.
Figure 9:
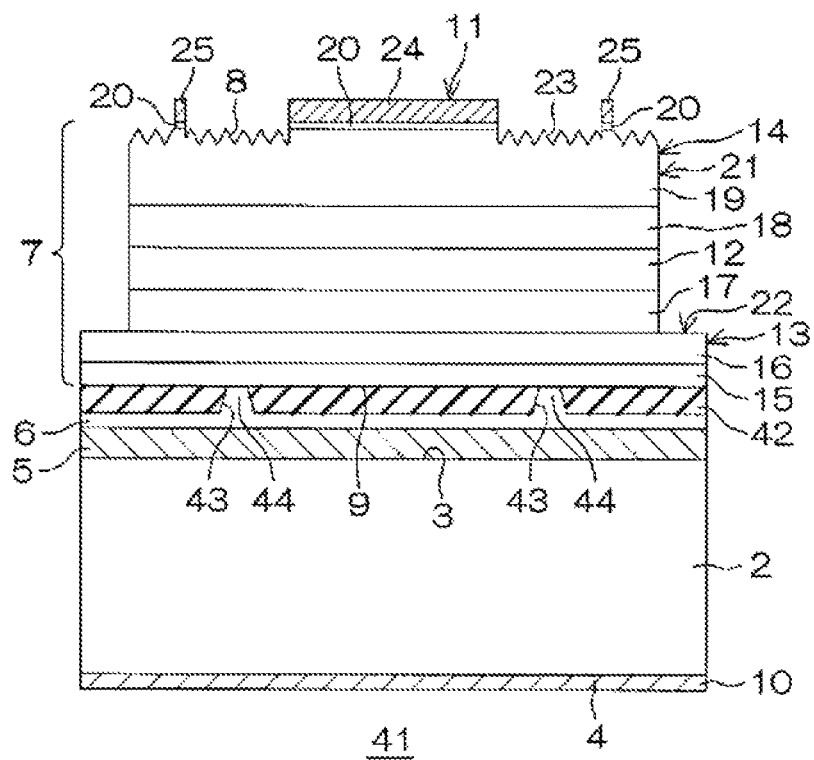
FIG. 9 is a sectional view of the semiconductor light emitting device according to the second embodiment of the present disclosure, which is taken along line IX-IX in FIG. 8.

It is considered that the significant increase in the forward voltage (VF) at the time of using another chemical solution occurs because the etching rate is too fast and the side-etching amount is increased excessively, as a result of which the contact area between the cathode electrode layer 11 and the n-type contact layer 20 is greatly reduced. FIG. 8 is a plan view of a semiconductor light emitting device 41 according to a second embodiment of the present disclosure. FIG. 9 is a sectional view of the semiconductor light emitting device 41 according to the second embodiment of the present disclosure, which is taken along line IX-IX in FIG. 8. In FIGS. 8 and 9, the same elements as those shown in FIGS. 1 and 2 described above are denoted by like reference numerals. The description thereof is omitted.

In the semiconductor light emitting device 41, an insulating layer 42 is disposed between the light-transmitting conductive layer 6 and the compound semiconductor layer 7. In the present embodiment, the insulating layer 42 may be made of $SiO_2$, SiN or $MgF_2$. Furthermore, the insulating layer 42 is formed so as to cover the entire front surface of the light-transmitting conductive layer 6. In addition, the (total) thickness of the insulating layer 42 may be, for example, 0.1 μm to 0.5 μm.

On the other hand, the light-transmitting conductive layer 6 and the compound semiconductor layer 7 are separated by the insulating layer 42. Therefore, the light-transmitting conductive layer 6 includes contact portions 44 connected to the p-type contact layer 15 through contact holes 43 penetrating the insulating layer 42. Thus, an ODR (Omni-Directional-Reflector) structure is formed in the semiconductor light emitting device 41. The contact portions 44 are discretely arranged in the plane of the substrate 2 as shown in FIG. 8. For example, the contact portions 44 may be arranged in a matrix pattern in the mesa portion 21 having a rectangular shape in a plan view.

In addition, as shown in FIG. 9, each contact portion 44 may have a taper shape in a sectional view in which the tip of each contact portion 44 is narrowed toward the compound semiconductor layer 7. Although not shown, the space 30 shown in FIG. 3A is also formed below the cathode electrode layer 11 of the semiconductor light emitting device 41 according to the second embodiment. FIGS. 10A to 10J are views showing a process of manufacturing the semiconductor light emitting device 41 of FIGS. 8 and 9 in the order of steps.

Figure 10A:
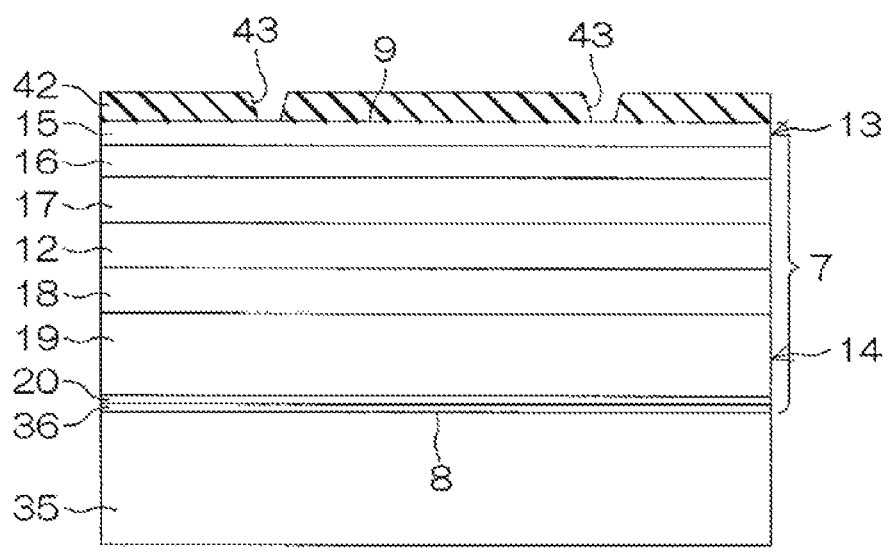
FIG. 10A is a view showing a step of a method for manufacturing the semiconductor light emitting device.

In order to manufacture the semiconductor light emitting device 41, for example, as shown in FIG. 10A, a compound semiconductor layer 7 is formed by epitaxial growth on the growth substrate 35 as an example of the first substrate of the present disclosure made of GaAs or the like. As the growth method, for example, a known growth method such as a molecular beam epitaxial growth method or an organic metal vapor phase growth method may be used. At this stage, the compound semiconductor layer 7 includes an n-type etching stop layer 36, an n-type contact layer 20, an n-type window layer 19, an n-type cladding layer 18, a light-emitting layer 12, a p-type cladding layer 17, a p-type window layer 16 and a p-type contact layer 15 sequentially from the side of the growth substrate 35. After the formation of the compound semiconductor layer 7, an insulating layer 42 is formed by, for example, CVD. Thereafter, the contact holes 43 are formed by selectively etching the insulating layer 42.

Figure 10B:
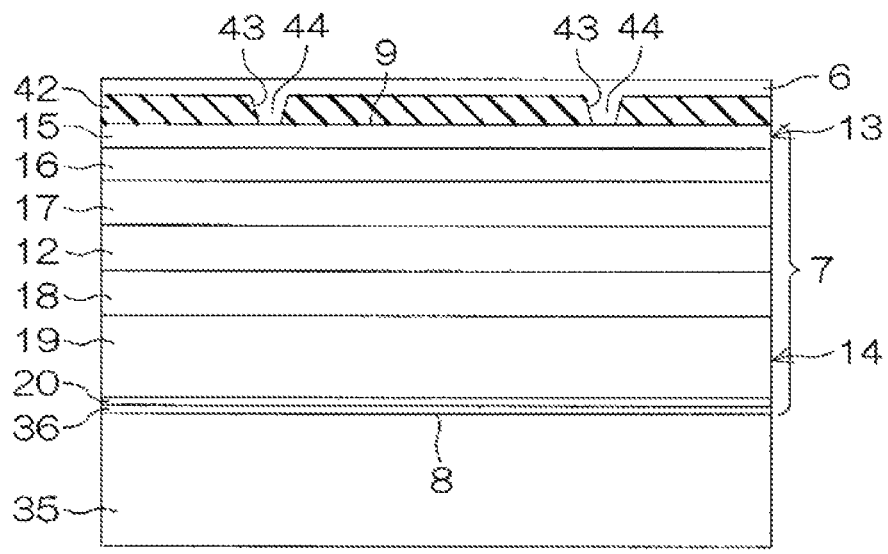
FIG. 10B is a view showing a step subsequent to the step of FIG. 10A.
Figure 10C:
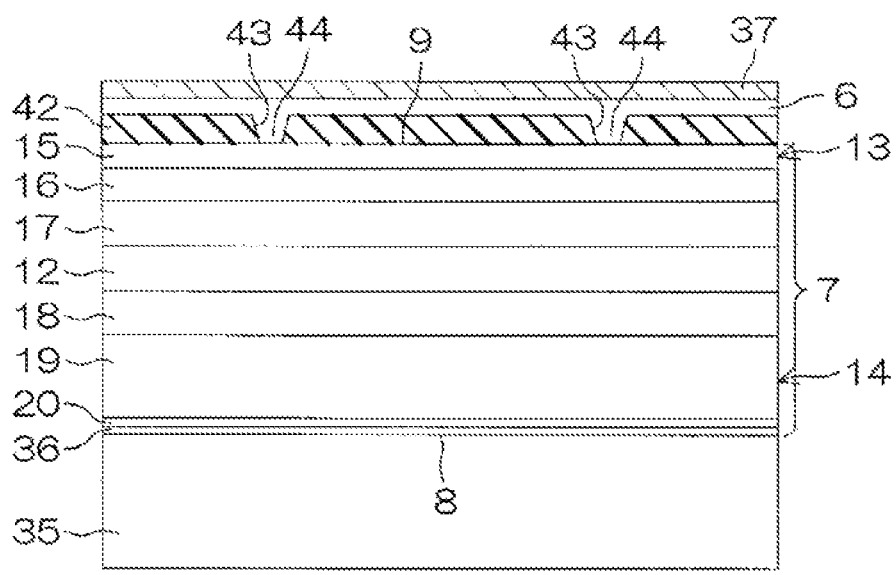
FIG. 10C is a view showing a step subsequent to the step of FIG. 10B.

Next, as shown in FIG. 10B, a light-transmitting conductive layer 6 is formed over the insulating layer 42 by, for example, vapor deposition. The light-transmitting conductive layer 6 enters the contact holes 43 and is connected to the p-type contact layer 15. Next, as shown in FIG. 10C, a first metal layer 37 (having a thickness of, e.g., 2.0 μm) is formed over the light-transmitting conductive layer 6 by, for example, vapor deposition. The first metal layer 37 is made of Au or an alloy containing Au. At least the outermost surface of the first metal layer 37 is formed of an Au layer.

The next step is a step of attaching the growth substrate 35 and the substrate 2 to each other. In the attaching step, the first metal layer 37 on the growth substrate 35 and a second metal layer 38 on the substrate 2 are bonded. The second metal layer 38 is made of Au or an alloy containing Au. At least the outermost surface of the second metal layer 38 is formed of an Au layer. The second metal layer 38 is formed at the first surface 3 of the substrate 2 by, for example, vapor deposition before the attaching thereof.

Figure 10D:
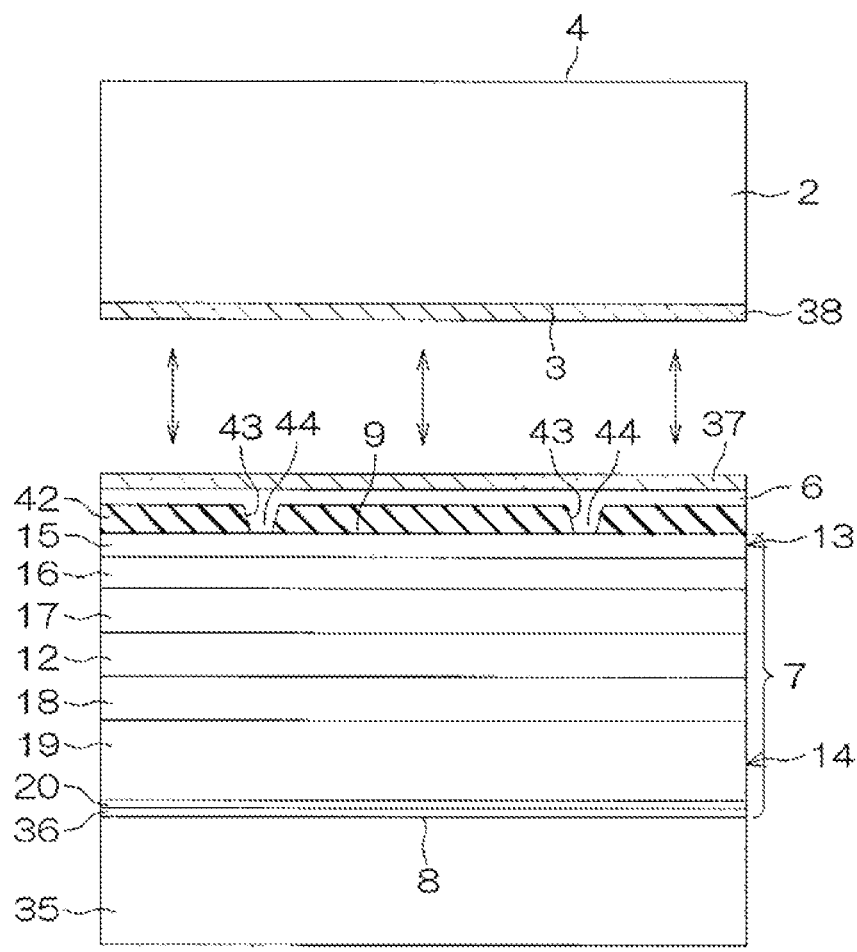
FIG. 10D is a view showing a step subsequent to the step of FIG. 10C.

More specifically, as shown in FIG. 10D, the growth substrate 35 and the substrate 2 are overlapped with each other in a state in which the first and second metal layers 37 and 38 face each other, whereby the first and second metal layers 37 and 38 are bonded. The bonding of the first and second metal layers 37 and 38 may be performed by, for example, thermal compression bonding. The thermal compression bonding conditions may be, for example, a temperature of 250 degrees C. to 350 degrees C. and a pressure of 30 kN to 45 kN. By this bonding, as shown in FIG. 10E, the first and second metal layers 37 and 38 are combined to form a metal layer 5.

Next, as shown in FIG. 10E, the growth substrate 35 is removed by, for example, wet etching. Since the n-type etching stop layer 36 is formed at the outermost surface of the compound semiconductor layer 7, the n-type contact layer 20 and the n-type window layer 19 that contribute to the characteristics of the semiconductor light emitting device 41 are not affected during the wet etching. Thereafter, the n-type etching stop layer 36 is also removed.

Figure 10F:
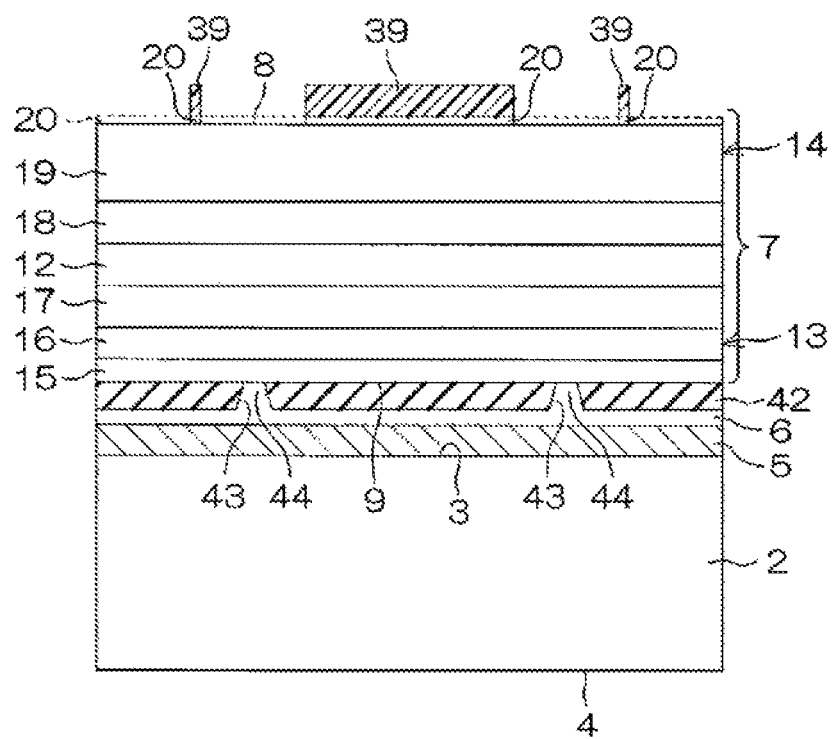
FIG. 10F is a view showing a step subsequent to the step of FIG. 10E.
Figure 10H:
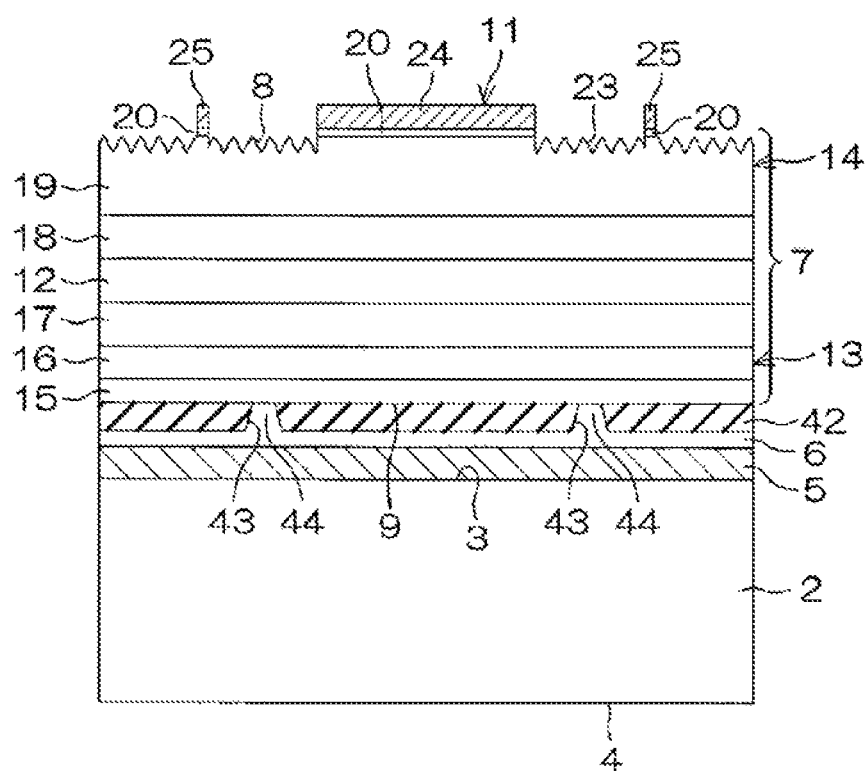
FIG. 10H is a view showing a step subsequent to the step of FIG. 10G.

The next steps are a step of processing unevenness on the n-type window layer 19, a step of forming a cathode electrode layer 11 and a step of side-etching the n-type contact layer 20. First, as shown in FIG. 10F, a resist 39 including openings having substantially the same pattern as the electrode pattern of the cathode electrode layer 11 is formed over the n-type contact layer 20. Thereafter, the n-type contact layer 20 exposed from the resist 39 is removed by etching. Thus, the n-type window layer 19 is exposed at portions other than the resist 39.

Next, as shown in FIG. 10G, an uneven portion 23 is formed at the front surface of the n-type window layer 19 exposed from the resist 39 by, for example, a frost process (wet etching) or the like. The frost process may be performed by dry etching. Thereafter, the resist 39 is removed. Thereafter, as the steps shown in FIGS. 6A to 6C, the cathode electrode layer 11 is formed (see also FIG. 10H), and side etching of the n-type contact layer 20 is performed.

Figure 10J:
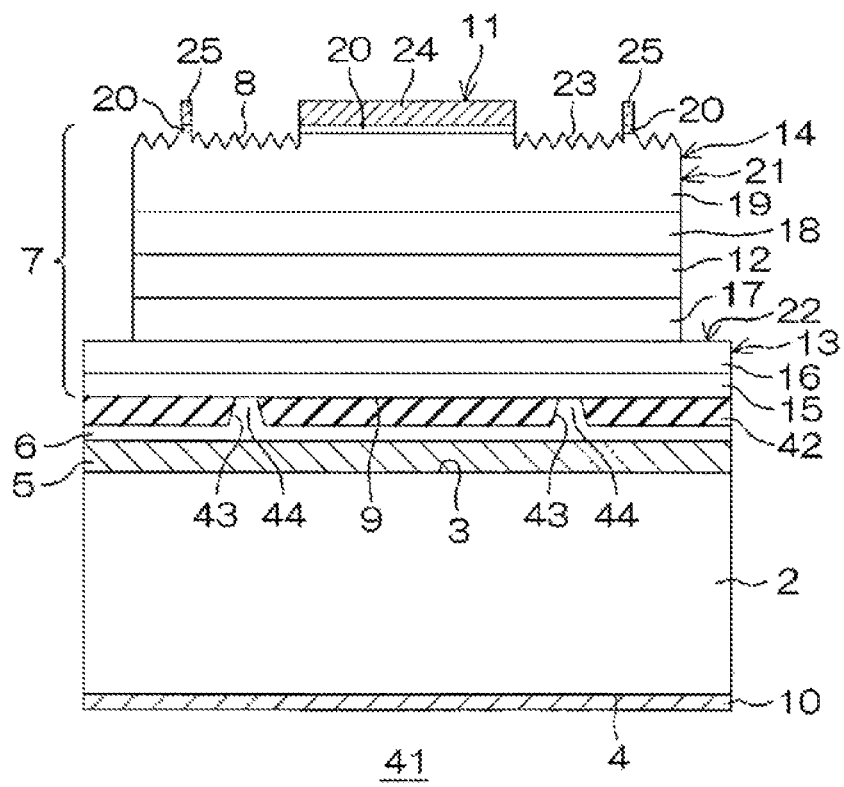
FIG. 10J is a view showing a step subsequent to the step of FIG. 10I.

Next, as shown in FIG. 10I, a mesa portion 21 and a lead-out portion 22 are formed by selectively removing the peripheral edge portion of the compound semiconductor layer 7. The mesa portion 21 and the lead-out portion 22 may be formed by, for example, wet etching. Next, as shown in FIG. 10J, an anode electrode layer 10 is formed at the second surface 4 of the substrate 2 by, for example, vapor deposition. The semiconductor light emitting device 41 is obtained through the above steps.

As described above, even in this semiconductor light emitting device 41, the space 30 is formed between the end portion 27 of the n-type contact layer 20 and the peripheral edge 26 of the cathode electrode layer 11. Therefore, the same effects as those of the semiconductor light emitting device 1 described above can be achieved. Next, a preferred embodiment of the structure of the semiconductor light emitting devices 1 and 41 will be described. More specifically, an embodiment in which a frost process is performed on the compound semiconductor layer 7 in two stages (double frost processes) and an embodiment in which vapor deposition processing of the AuGeNi layer 31 of the cathode electrode layer 11 is performed by dividing AuGeNi into AuGe and Ni (AuGe/Ni division vapor deposition) will be described.

<Double Frost Processes>

Figure 11:
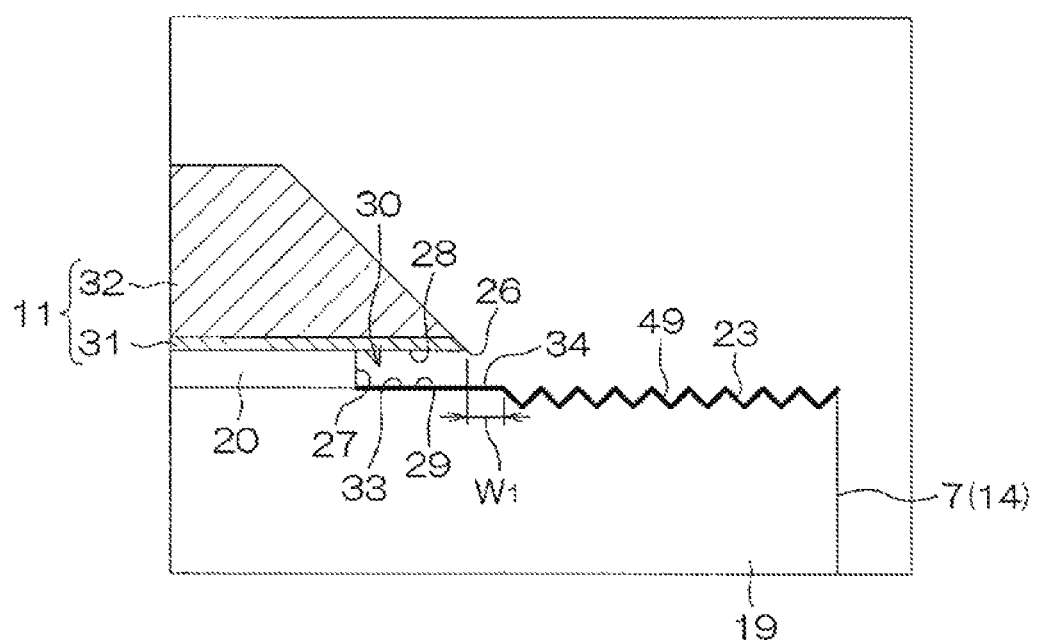
FIG. 11 is an enlarged view of a main part of the semiconductor light emitting device shown in FIG. 2.
Figure 12:
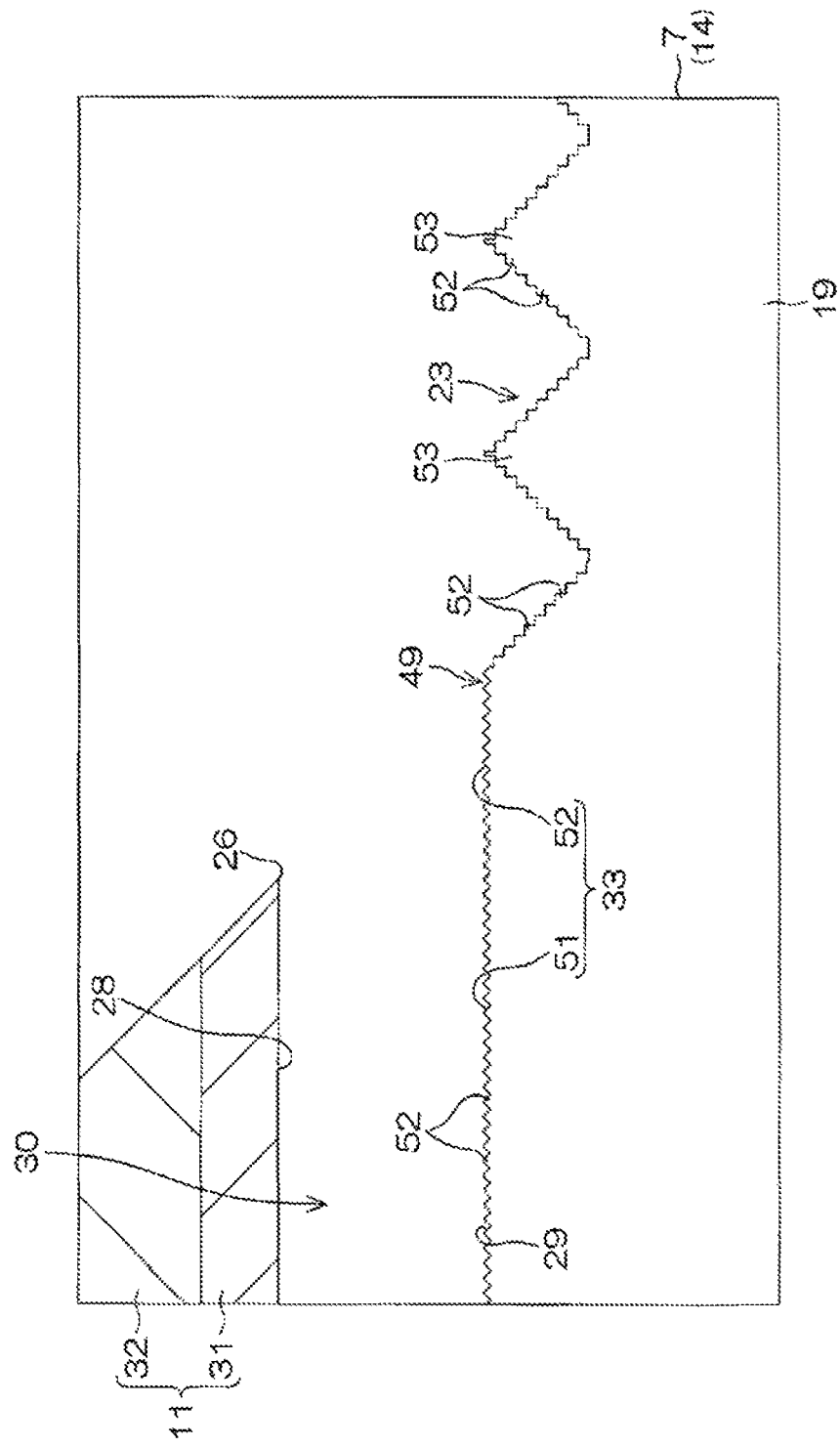
FIG. 12 is an enlarged view of the main part shown in FIG. 11.

FIG. 11 is an enlarged view of a main part of the semiconductor light emitting device 1 shown in FIG. 2. FIG. 12 is an enlarged view of a main part of FIG. 11.

First, in the above-described embodiment, as shown in FIG. 5F, the uneven portion 23 is formed in the n-type window layer 19 by performing the frost process only once. On the other hand, in the present embodiment, in addition to the uneven portion 23, a second uneven portion 50 (see FIG. 12) is formed in a processing region 49 indicated by a thick solid line in FIG. 11. The processing region 49 includes the entire n-type window layer 19 exposed from the n-type contact layer 20, and includes both the uneven portion 23 and the flat portion 33. In addition, the flat part 33 in the present embodiment means a portion in which the unevenness having substantially the same roughness as the uneven portion 23 is not formed. The unevenness having a fine roughness like the second uneven portion 50 may be formed in the flat portion 33.

More specifically, as shown in FIG. 12, the second uneven portion 50 is formed at the surface of the flat portion 33 and the surface of the uneven portion 23 in the n-type window layer 19. The flat portion 33 includes a first flat portion 51 in the space 30 covered with the cathode electrode layer 11 and a second flat portion 52 outside the cathode electrode layer 11. The second uneven portion 50 is formed at both the first flat portion 51 and the second flat portion 52.

In the uneven portion 23, the second uneven portion 50 is formed at the outer surface of each convex portion 53 of the uneven portion 23 (or referred to as the inner surface of each concave portion). That is, a relatively rough uneven portion 23 is formed over the entire upper surface 29 of the n-type window layer 19, and a finer second uneven portion 50 is formed over the entire surface of each convex portion 53 of the uneven portion 23. The second uneven portion 50 has an uneven structure smaller than the uneven portion 23. For example, the arithmetic mean roughness Ra (second roughness Ra) of the second uneven portion 50 is smaller than the arithmetic mean roughness Ra (first roughness Ra) of the uneven portion 23. For example, the second roughness Ra may be 0.01 µm to 0.1 µm, and the first roughness Ra may be 0.1 µm to 0.5 µm.

Furthermore, in FIG. 12, the second uneven portion 50 is formed at both the uneven portion 23 and the flat portion 33 of the n-type window layer 19. However, the second uneven portion 50 may be formed only on one of the uneven portion 23 and the flat portion 33. FIG. 13A is a view showing a step related to the formation of the uneven structure shown in FIG. 12. FIG. 13B is a view showing a step subsequent to the step of FIG. 13A.

In order to form the second uneven portion 50, first, as shown in FIG. 5F, the uneven portion 23 is formed at the surface of the n-type window layer 19 by, for example, a frost process (wet etching) or the like. Next, after the cathode electrode layer 11 is formed as shown in FIG. 6B, the n-type contact layer 20 exposed from the cathode electrode layer 11 is selectively removed with a nitric acid-based dilute solution as shown in FIG. 6C. Thus, a space 30 is formed below the cathode electrode layer 11. The state available after the formation of the space 30 is the state shown in FIG. 13A. At this time, an oxide film (not shown) may be formed at the surface of the n-type window layer 19 by the oxidizing action of the nitric acid-based dilute solution used as an etching solution.

Next, as shown in FIG. 13B, the second uneven portion 50 is formed at the uneven portion 23 and the flat portion 33 of the n-type window layer 19 by wet etching using an etching solution, which is different from the frost process (first frost process) shown in FIG. 5F (second frost process). Examples of the etching solution used include a dilute hydrochloric acid. By using the dilute hydrochloric acid as an etching solution, even if the surface of the n-type window layer 19 is covered with an oxide film, it is possible to dissolve the oxide film with the dilute hydrochloric acid and to satisfactorily form the second uneven portion 50. Moreover, since the dilute hydrochloric acid also enters the space 30, the n-type contact layer 20 is further side-etched. Thus, the end portion 27 of the n-type contact layer 20 may further recede.

Figure 14A:
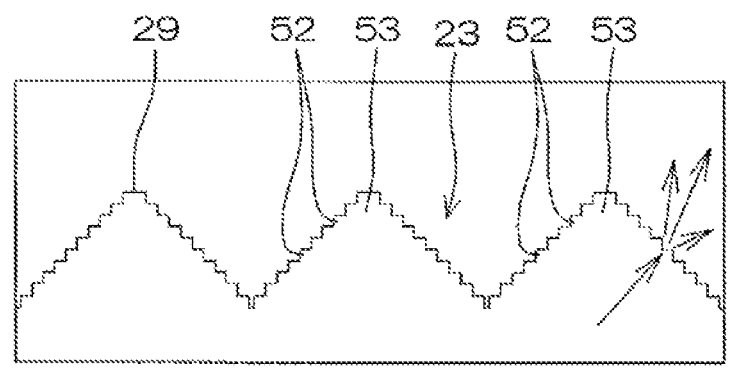
FIG. 14A is a view showing a light transmission state in the uneven structure shown in FIG. 12.
Figure 14B:
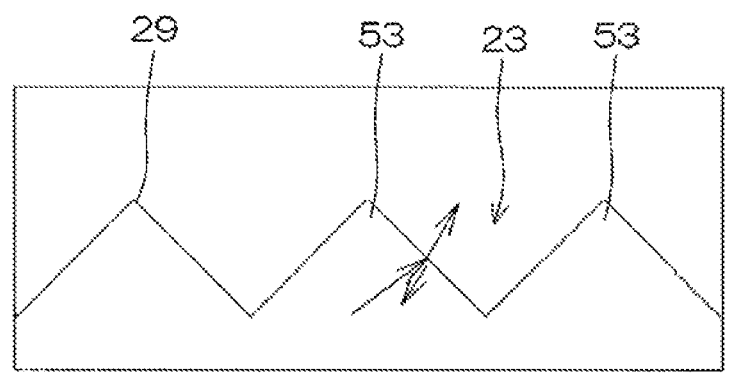
FIG. 14B is a view for comparison with the light transmission state shown in FIG. 14A.

In the dilute hydrochloric acid, the volume ratio of water to 1 hydrochloric acid may be, for example, 0.5 to 5 (for example, HCl: $H_2O$=1:3). Furthermore, the etching time may be, for example, 10 seconds to 100 seconds, and the temperature may be, for example, 30 degrees C. to 40 degrees C. In this way, the second uneven portion 50 is formed at the surface of each convex portion 53 of the uneven portion 23. Thus, as indicated by arrows in FIG. 14A, the total reflection of light on the surface of each convex portion 53 can be suppressed, and the light can be extracted well from the upper surface 29 of the n-type window layer 19. On the other hand, if the second uneven portion 50 is not formed, the total reflection may occur on the surface of each convex portion 53 as indicated by arrows in FIG. 14B, and the light extraction efficiency may be lower than that of the structure in which the second uneven portion 50 is formed.

Figure 16:
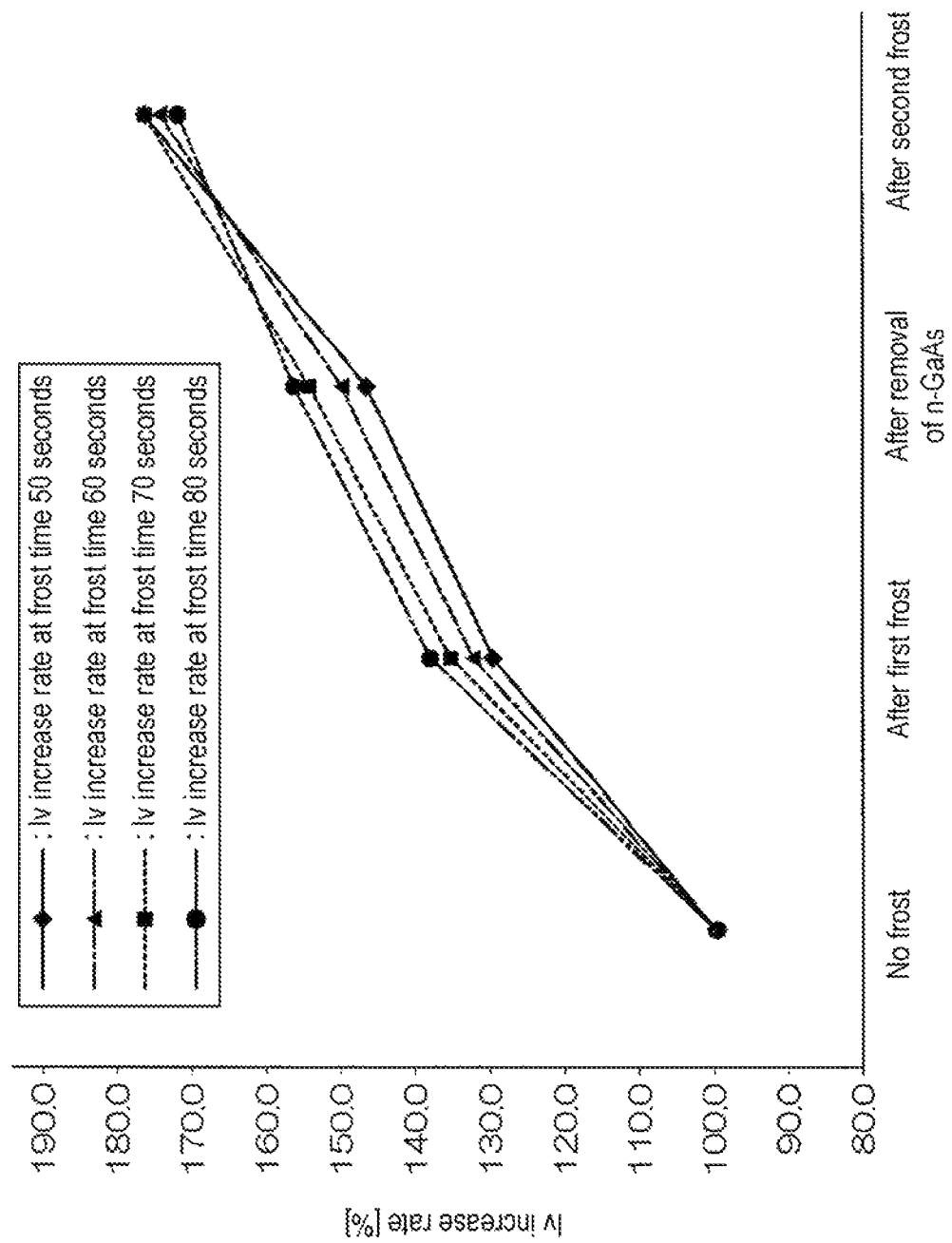
FIG. 16 is a view showing a relationship between a frost time and the Iv increase rate.

FIG. 15 is a view showing an Iv increase rate of the semiconductor light emitting device 1. FIG. 16 is a view illustrating the relationship between the frost time and the Iv increase rate. Next, with reference to FIGS. 15 and 16, the effect of the double frost processes will be described based on experimental data. In FIGS. 15 and 16, the term "No frost" indicates a state before the frost process is performed on the upper surface of the n-type window layer 19 (for example, the state shown in FIG. 5E), and the term "After removal of n-GaAs removal" indicates a state after the side etching of the n-type contact layer 20 and before the second frost process (for example, the state shown in FIG. 13A).

Furthermore, the processing conditions for the first frost process are as follows. The chemical solution is "Pure Etch 150" manufactured by Hayashi Pure Chemical Industries, Ltd., the processing temperature is 40±2 degrees C., and the processing time is 50, 60, 70 and 80 seconds (no oscillation). On the other hand, the processing conditions of the second frost process are as follows. The chemical solution is a dilute hydrochloric acid (hydrochloric acid: water=1:3), the processing temperature is 32±2 degrees C., and the processing time is 50 seconds (no oscillation). As a result of the experiment, as shown in FIG. 15, if the double frost processes in which both the first frost process and the second frost process are performed are implemented, the increase rate of the luminous intensity Iv can be increased to about 160% as compared with the case where the frost process is not performed. Furthermore, by forming the second uneven portion 50 even in the peripheral portion 34 of the n-type window layer 19, it is possible to increase the Iv increase rate to about 180%.

Furthermore, as shown in FIG. 16, until the n-GaAs (n-type contact layer 20) removal step, the Iv increase rate tends to be higher as the frost time grows longer. On the other hand, it was found that when the second frost process is performed, the Iv increase rate becomes finally uniform regardless of the frost time.

<Ni Division Vapor Deposition>

Figure 17A:
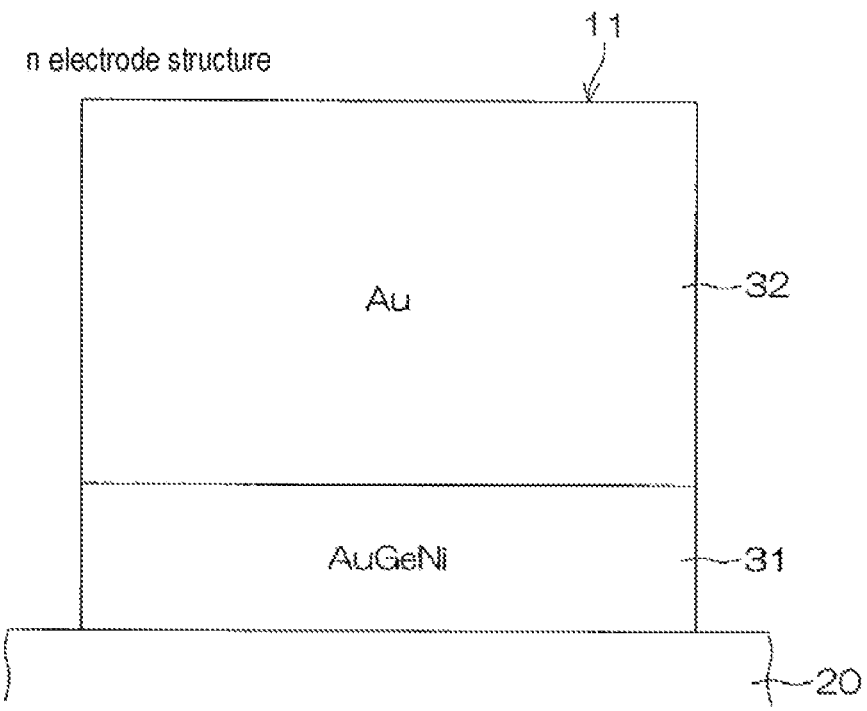
FIG. 17A is a view showing a first structure of a cathode electrode layer.
Figure 17B:
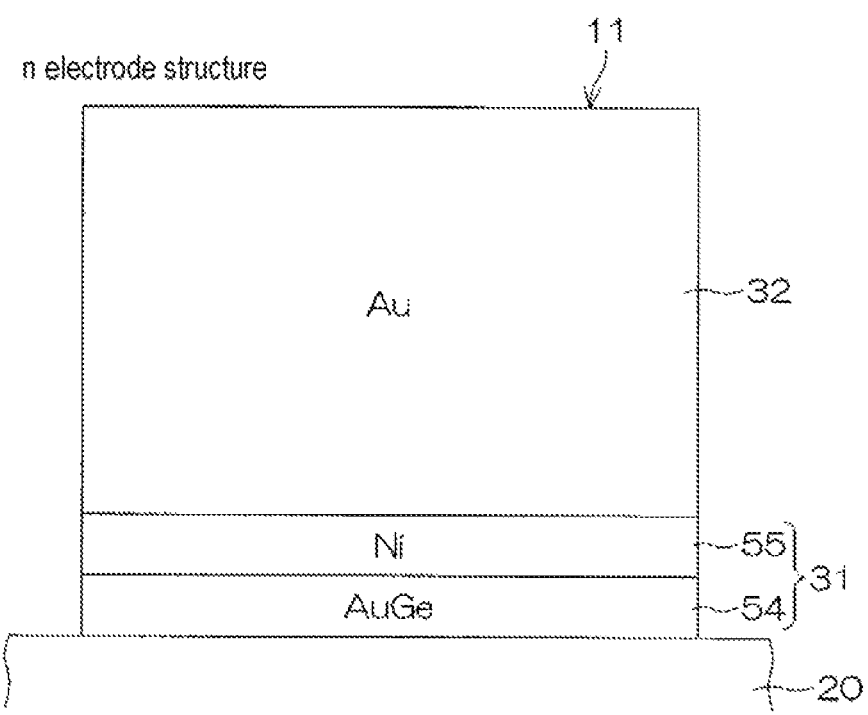
FIG. 17B is a view showing a second structure of the cathode electrode layer.

FIG. 17A is a view showing a first structure of the cathode electrode layer 11. FIG. 17B is a view showing a second structure of the cathode electrode layer 11.

First, in the above-described embodiment, as shown in FIG. 17A, the AuGeNi layer 31 of the cathode electrode layer 11 is formed by simultaneously vaporizing Au, Ge and Ni and then attaching and depositing them on the n-type contact layer 20. On the other hand, in the present embodiment, the AuGeNi layer 31 of the cathode electrode layer 11 is formed by simultaneously vaporizing Au and Ge to first attach and deposit an AuGe layer 54 on the n-type contact layer 20, and then vaporizing Ni to attach and deposit an Ni layer 55 on the AuGe layer 54. That is, AuGe and Ni are divisionally vapor-deposited. Both the AuGe layer 54 and the Ni layer 55 may contain a small amount of impurities as long as the following effects can be exhibited.

In the semiconductor light emitting device 1 including the cathode electrode layer 11 formed by divisionally depositing Ni as described above, it is possible to suppress an increase in the forward voltage (VF) as compared with the case where AuGeNi is simultaneously deposited. As described above, in this semiconductor light emitting device 1, the contact area of the n-type contact layer 20 with the cathode electrode layer 11 is reduced as compared with the case where the entire n-type contact layer 20 is in contact with the cathode electrode layer 11. Therefore, there is a concern that the forward voltage (VF) increases. As shown in FIG. 7, by forming the space 30 with the nitric acid-based dilute solution, it is possible to suppress an increase in the forward voltage (VF). However, if the Ni division vapor deposition according to the present embodiment is adopted, it is possible to further suppress an increase in the forward voltage (VF).

In FIG. 17B, the boundary between the AuGe layer 54 and the Ni layer 55 is clearly shown as the state of the cathode electrode layer 11 immediately after the vapor deposition of the Ni layer 55. However, in the cathode electrode layer 11 of the semiconductor light emitting device 1 after completion, there may be no clear boundary between the AuGe layer 54 and the Ni layer 55. Therefore, the structure of the cathode electrode layer 11 may be indicated as AuGe/Ni for the sake of convenience.

Figure 19:
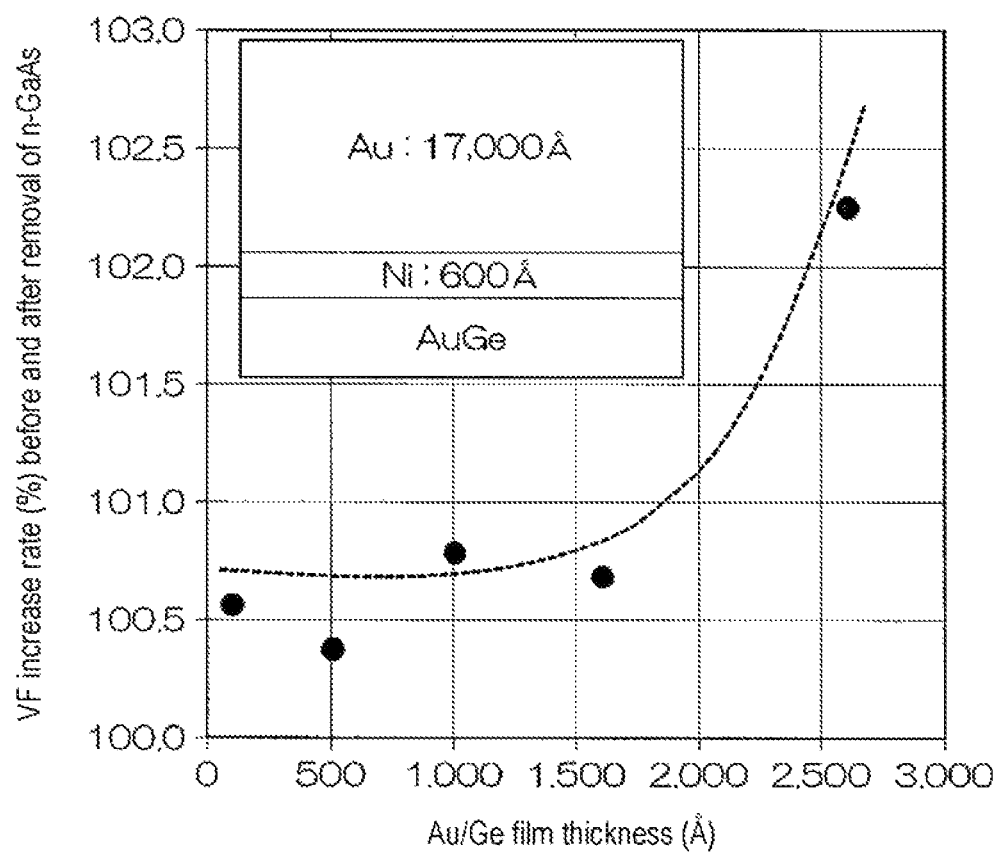
FIG. 19 is a view showing a relationship between an AuGe film thickness and a VF increase rate.
Figure 20:
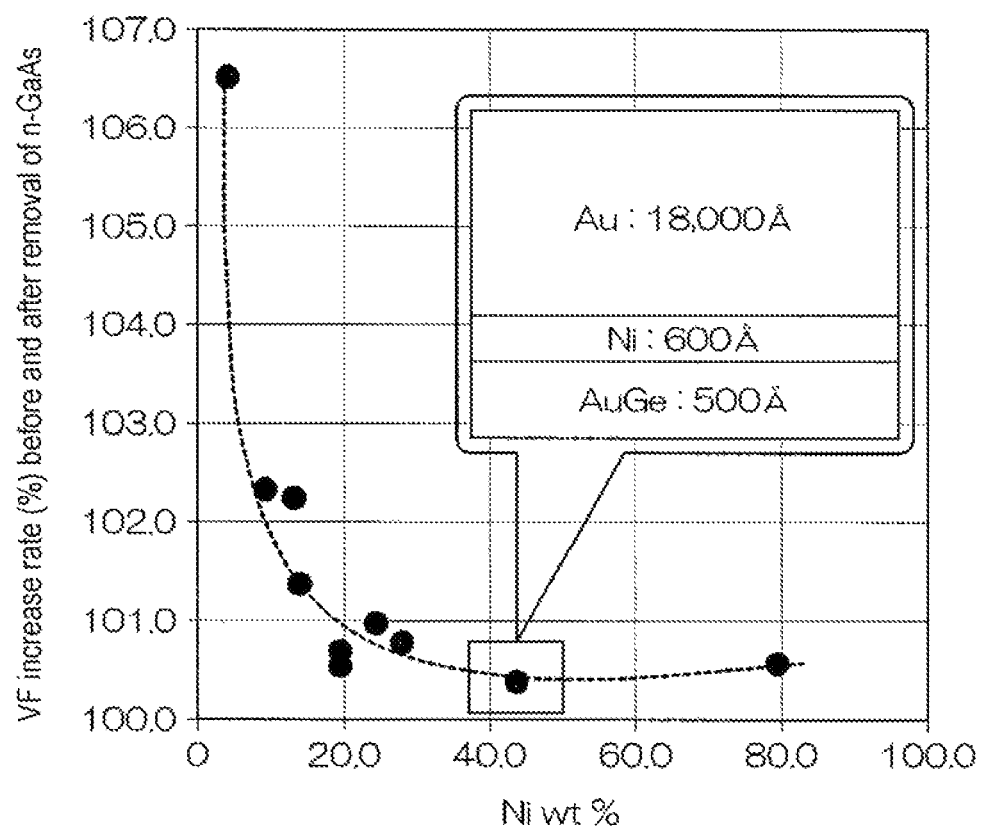
FIG. 20 is a view showing a relationship between a Ni content ratio to AuGe/Ni and a VF increase rate.

Next, it was verified how the increase rate of the forward voltage (VF) of the semiconductor light emitting device 1 is changed depending on the thickness of the Ni layer 55, the thickness of the AuGe layer 54 and the Ni content ratio with respect to the entire cathode electrode layer 11 (AuGe/Ni). FIG. 18 is a view showing the relationship between the thickness of the Ni layer 55 and the VF increase rate. FIG. 19 is a view showing the relationship between the thickness of the AuGe layer 54 and the VF increase rate. FIG. 20 is a view showing the relationship between the Ni content ratio with respect to AuGe/Ni and the VF increase rate.

More specifically, FIG. 18 shows the results of experiments in which the vapor deposition thickness of the AuGe layer 54 is fixed to 1600 Å, and the vapor deposition thickness of the Ni layer 55 is respectively assigned 100 Å, 250 Å, 400 Å, 600 Å (twice) and 800 Å. FIG. 19 shows the results of experiments in which the vapor deposition thickness of the Ni layer 55 is fixed to 600 Å, and the vapor deposition thickness of the AuGe layer 54 is respectively assigned 100 Å, 500 Å, 1000 Å, 1600 Å (twice) and 2600 Å. FIG. 20 shows the result of calculating the relationship between the Ni content ratio with respect to AuGe/Ni and the VF increase rate based on the results obtained from FIGS. 18 and 19.

From the results of FIGS. 18 to 20, it was found that when the Ni content ratio (weight ratio) with respect to AuGe/Ni is 20 wt % or larger, the VF increase rate is stabilized at 1% or smaller. On the other hand, it was found that the lower the Ni content ratio, the higher the VF increase rate. Next, it was verified what difference can be observed in the cross-sectional structure of the cathode electrode layer 11 depending on the Ni content ratio. More specifically, the cathode electrode layer 11 was vapor-deposited with the film thickness and content shown in Table 1 below.

TABLE 1

| Material | ① Film thickness (Å) | ① Content (wt %) | ② Film thickness (Å) | ② Content (wt %) | ③ Film thickness (Å) | ③ Content (wt %) |
|---|---|---|---|---|---|---|
| Ni | 600 | 43.5 | 600 | 19.4 | 100 | 3.9 |
| Au | 195 | 48.0 | 625 | 12.1 | 625 | 81.7 |
| Ge | 305 | 8.5 | 975 | 68.5 | 975 | 14.4 |

Figure 21:
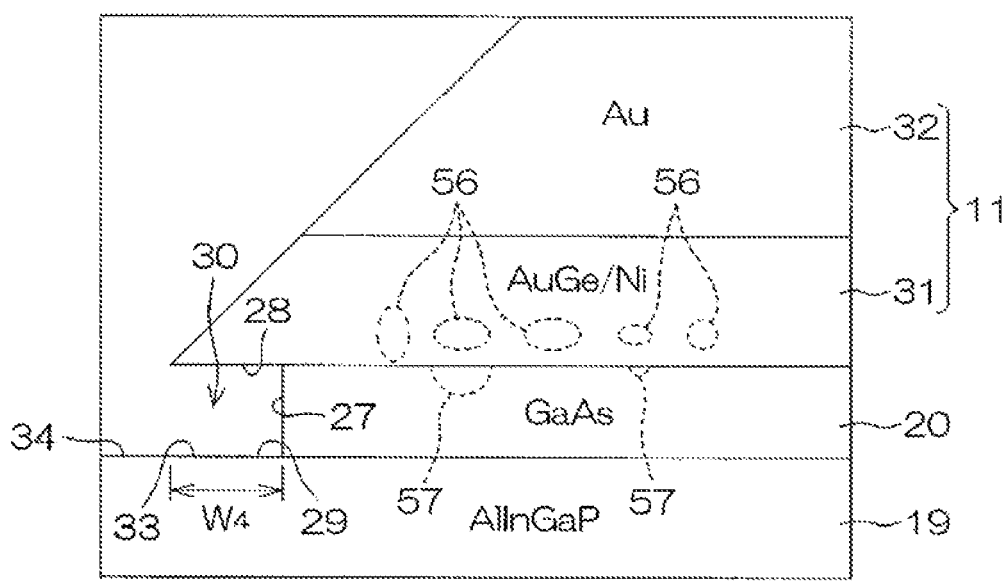
FIG. 21 is a view schematically showing a TEM image of a cathode electrode layer (Ni content: 43.5%).
Figure 22:
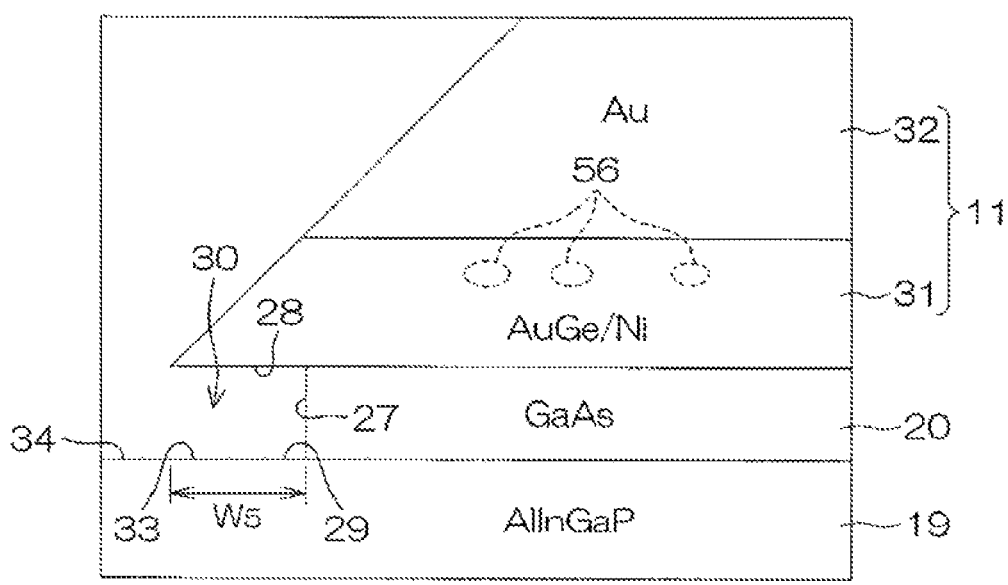
FIG. 22 is a view schematically showing a TEM image of a cathode electrode layer (Ni content: 19.4%).
Figure 23:
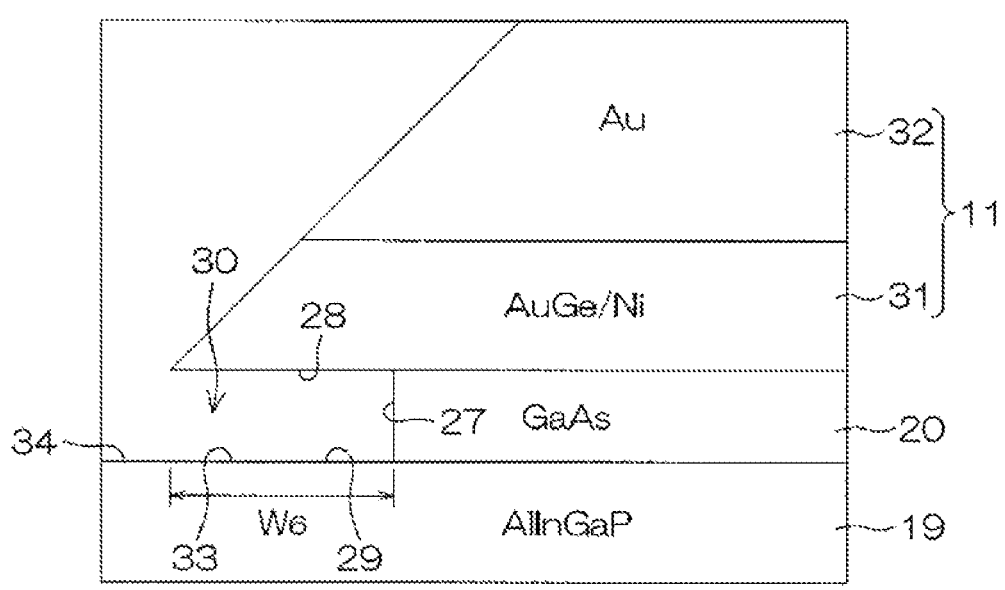
FIG. 23 is a view schematically showing a TEM image of a cathode electrode layer (Ni content: 3.9%).

FIG. 21 is a view schematically showing a TEM image of the cathode electrode layer 11 (Ni content: 43.5%). FIG. 22 is a view schematically showing a TEM image of the cathode electrode layer 11 (Ni content: 19.4%). FIG. 23 is a view schematically showing a TEM image of the cathode electrode layer 11 (Ni content: 3.9%). FIGS. 21 and 22 also show a Ni distribution image 56 obtained by TEM-EDX elemental analysis of the cathode electrode layer 11.

Figure 24:
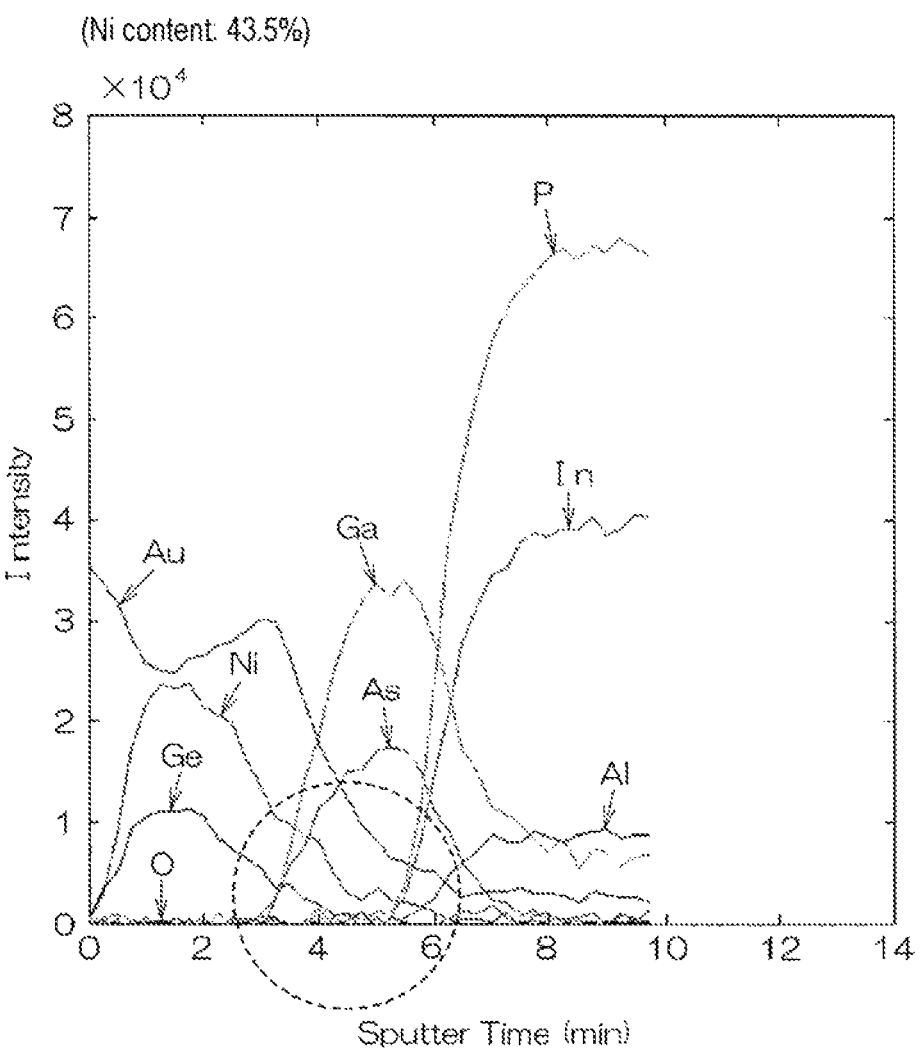
FIG. 24 is a view showing an element distribution obtained by AES analysis in a depth direction from the surface of the cathode electrode layer (Ni content: 43.5%).

First, comparison of the side-etching amounts W4, W5, and W6 of FIGS. 21, 22 and 24 reveals that the higher the Ni content ratio, the smaller the side-etching amount. That is, it is considered that as the Ni content ratio is higher, the decrease in the contact area between the cathode electrode layer 11 and the n-type contact layer 20 is suppressed and the increase in the forward voltage (VF) is suppressed. Furthermore, as shown in FIG. 21, it was observed that when the Ni content ratio is high, an eutectic portion 57 with Ni is formed in the n-type contact layer 20 (GaAs layer).

In addition, the TEM-EDX elemental analysis reveals that if the Ni content ratio is high as shown in FIG. 21, an Ni distribution image 56 is observed at the contact portion (near the boundary) of the AuGe/Ni layer 31 making contact with the n-type contact layer 20 and the distribution of AuGe is uniform. On the other hand, in FIG. 22 where the Ni content ratio is 19.4%, a Ni distribution image 56 is observed. However, compared with FIG. 21, the Ni distribution image 56 is distributed in a portion farther from the contact portion (near the boundary) of the AuGe/Ni layer 31 making contact with the n-type contact layer 20. In addition, the distribution intensity is small. In the case of FIG. 23, the Ni distribution image could not be observed.

Figure 25:
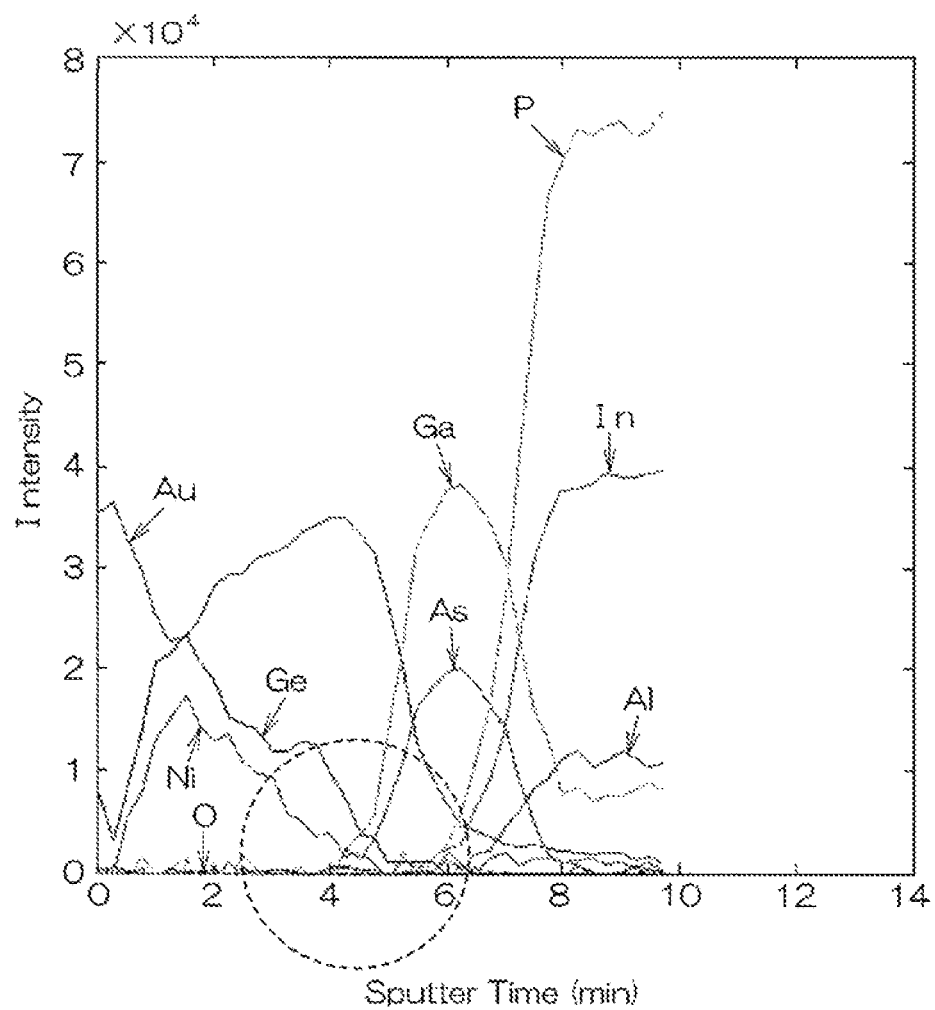
FIG. 25 is a view showing an element distribution obtained by AES analysis in a depth direction from the surface of the cathode electrode layer (Ni content: 19.4%).
Figure 26:
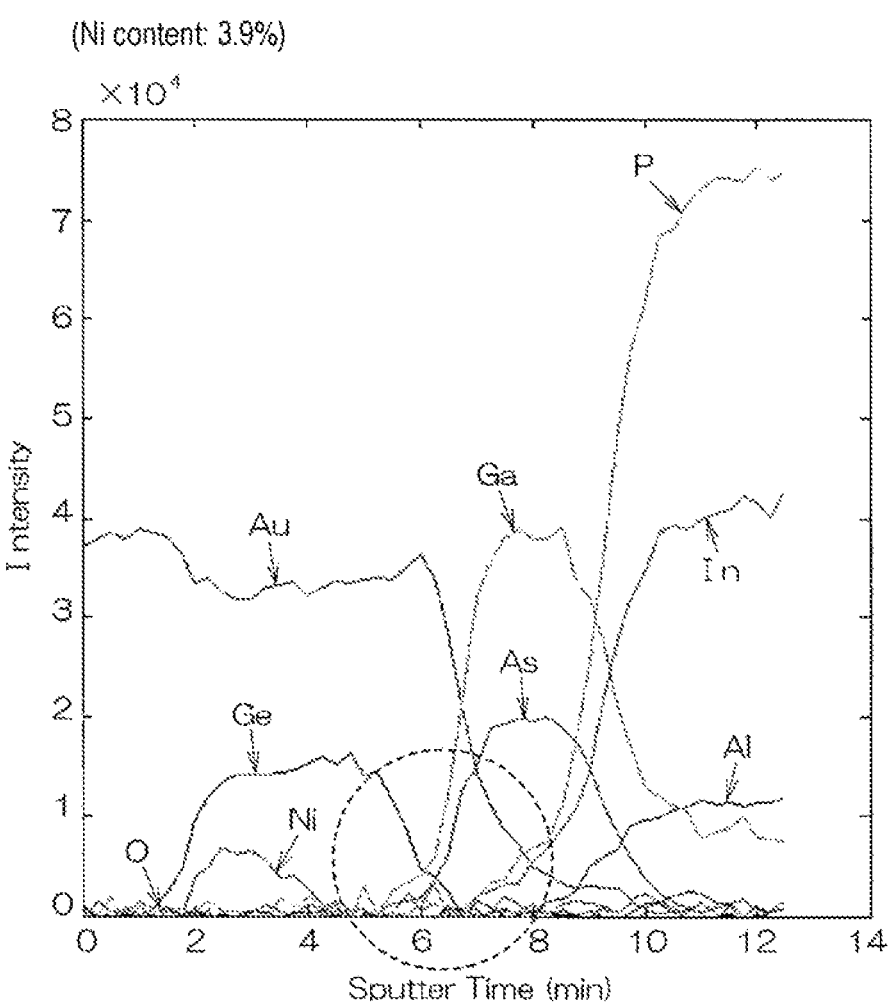
FIG. 26 is a view showing an element distribution obtained by AES analysis in a depth direction from the surface of the cathode electrode layer (Ni content: 3.9%).

Next, it was verified what difference can be observed in the composition in the depth direction of the cathode electrode layer 11 depending on the Ni content ratio. FIG. 24 is a view showing an element distribution obtained by AES analysis conducted in the depth direction from the surface of the cathode electrode layer 11 (Ni content: 43.5%). FIG. 25 is a view showing an element distribution obtained by AES analysis conducted in the depth direction from the surface of the cathode electrode layer 11 (Ni content: 19.4%). FIG. 26 is a view showing an element distribution obtained by AES analysis conducted in the depth direction from the surface of the cathode electrode layer 11 (Ni content: 3.9%).

First, as shown in FIG. 24 (particularly, referring to a portion surrounded by a broken line), it was found that if the Ni content ratio is high, Ni and Ge are diffused into the n-type contact layer 20 (GaAs layer). On the other hand, as shown in FIGS. 25 and 26 (particularly referring to the portion surrounded by a broken line), when the Ni content ratio is not high, almost no diffusion of Ni and Ge into the n-type contact layer 20 (GaAs layer) is observed. That is, the higher the Ni content ratio, the larger the Ni peak, and more Ni and Ge diffusion into the n-type contact layer 20 (GaAs layer) is observed.

Generally, when forming an ohmic contact with GaAs or AlGaAs, the reaction at the contact interface is difficult to proceed. Therefore, the reaction can be promoted by introducing Ni. However, if Ni reacts too much, the contact surface is roughened and easily peeled off. Therefore, Ni is deposited on AuGe by separating Ni from the interface in order to control Ni. However, if the amount of Ni is too small, the eutectic with the GaAs layer or the AlGaAs layer becomes insufficient. Therefore, an optimum amount of Ni for obtaining a uniform eutectic portion is required.

Figure 27:
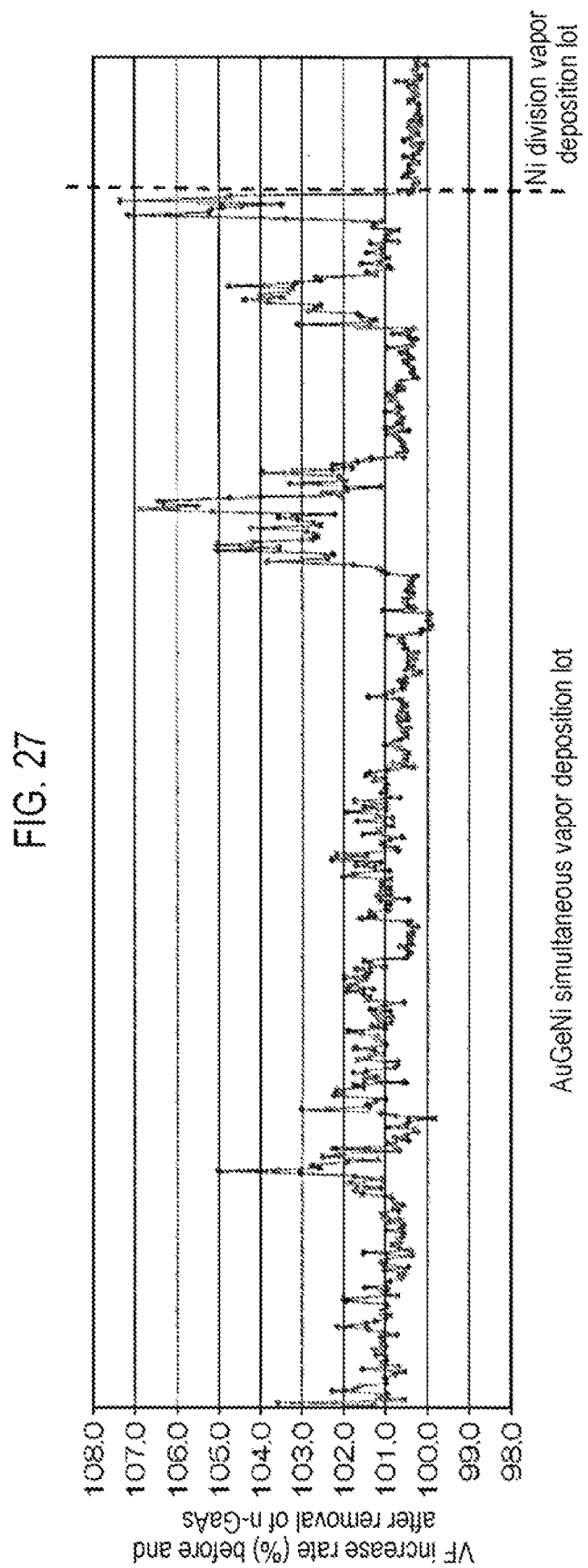
FIG. 27 is a view showing the VF increase rate of the semiconductor light emitting device for each lot.

From the results of TEM-EDX elemental analysis described above, it can be said that the Ni content of 43.5% where uniform precipitation of AuGe is observed is a good condition. It is considered that by vapor-depositing an appropriate amount of Ni in this way, the reaction at the interface of the epitaxial layer and metal is promoted, and Au, Ge and Ni are diffused into the GaAs layer. Next, it was verified what change in the VF increase rate of the semiconductor light emitting device 1 is observed for each lot. FIG. 27 is a view showing the VF increase rate of the semiconductor light emitting device 1 for each lot.

First, in the AuGeNi simultaneous vapor deposition lot (the number of samples n=432), AuGeNi/Au=2000 Å/17000 Å is adopted as a vapor deposition recipe for the cathode electrode layer 11. On the other hand, in the Ni division vapor deposition lot (the number of samples n=49), AuGe/Ni/Au=500 Å/600 Å/18000 Å is used as the vapor deposition recipe for the cathode electrode layer 11. As calculated from the results of FIG. 27, in the AuGeNi simultaneous vapor deposition lot, the average VF increase rate is 101.3%, the maximum VF increase rate is 107.3%, and the minimum VF increase rate is 99.9%. On the other hand, in the Ni division vapor deposition lot, the average VF increase rate is 100.3%, the maximum VF increase rate is 100.8%, and the minimum VF increase rate is 100.1%. That is, in the lot adopting the Ni simultaneous vapor deposition recipe, the VF increase rate can be stabilized at 1% or smaller.

Figure 28:
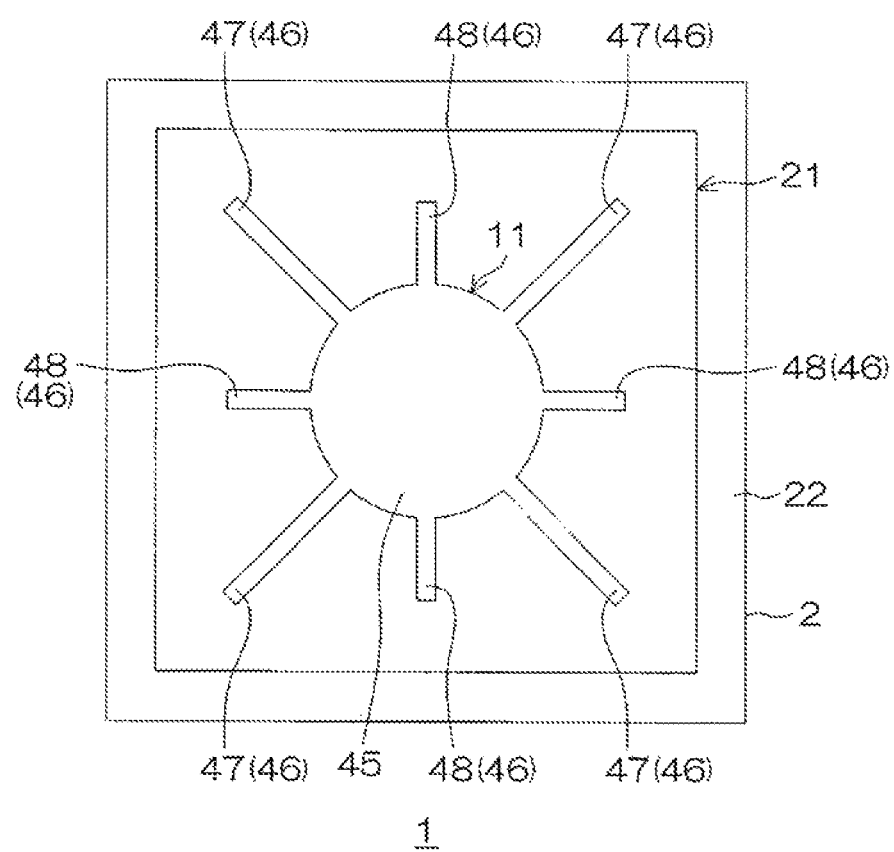
FIG. 28 is a view showing a modification of the pattern of the cathode electrode layer.

Although the embodiments of the present disclosure have been described above, the present disclosure may also be implemented in other forms. For example, as shown in FIG. 28, the cathode electrode layer 11 may integrally include a substantially circular pad electrode portion 45 and branch electrode portions 46 extending radially around the pad electrode portion 45. More specifically, in a plan view, the pad electrode portion 45 is disposed substantially at the center of the substrate 2, and the branch electrode portions 46 extend in eight directions from the pad electrode portion 45 toward the four side surfaces and the four corners of the substrate 2. In FIG. 28, the branch electrode portions 46 (first portions 47) extending toward the four corners of the substrate 2 are longer than the branch electrode portions 46 (second portions 48) extending toward the four side surfaces of the substrate 2.

In the second embodiment, the light-transmitting conductive layer 6 is interposed between the insulating layer 42 and the metal layer 5. However, the light-transmitting conductive layer 6 may be omitted. In this case, a metal layer may be provided as the contact portion 44. Furthermore, in the above-described embodiments, when the semiconductor light emitting devices 1 and 41 are manufactured, the step of bonding the growth substrate 35 and the substrate 2 is performed. However, this bonding step is not essential. For example, a step of sequentially stacking the metal layer 5, the light-transmitting conductive layer 6, the insulating layer 42 and the compound semiconductor layer 7 on the substrate 2 may be performed.

In addition, various design changes may be made within the scope of matters recited in the claims.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method for manufacturing a semiconductor light emitting device, comprising:
    forming a semiconductor structure including a substrate, a metal layer formed over the substrate, and a semiconductor layer that is formed over the metal layer and includes a light-emitting layer, a first conductivity type layer disposed at a substrate side with respect to the light-emitting layer and a second conductivity type layer disposed at an opposite side to the substrate with respect to the light-emitting layer, the second conductivity type layer including a first layer configured to form a surface of the semiconductor layer and a second layer disposed at the substrate side with respect to the first layer;
    exposing a surface of the second layer by selectively removing the first layer;
    forming an uneven portion at the surface of the second layer by performing a frost process on the exposed surface of the second layer;
    forming, after the act of forming the uneven portion, a second electrode over the first layer;
    forming a space between an end portion of the first layer and a peripheral edge of the second electrode by side-etching the first layer toward a lower side of the second electrode using a nitric acid-based dilute solution; and
    forming a first electrode below the substrate.

2. The method of claim 1, further comprising:
    performing, after the act of forming the space, the frost process on a portion of the second layer facing the second electrode across the space and on the uneven portion using a dilute hydrochloric acid.

3. The method of claim 1, wherein the first layer of the second conductivity type layer includes an n-type GaAs contact layer, and
    wherein the act of forming the second electrode includes:
        a first act of forming a layer containing Au and Ge by vaporizing a first vapor deposition material containing Au and Ge and depositing the first vapor deposition material on the n-type GaAs contact layer; and
        a second act of forming, after the first act, a layer containing Ni by vaporizing a second vapor deposition material containing Ni and depositing the second vapor deposition material on the layer containing Au and Ge.

4. The method of claim 3, wherein a weight ratio of Ni to a total amount of Au, Ge and Ni is 20 wt % or larger.

5. The method of claim 1, wherein the act of forming the semiconductor structure includes:
    forming the second conductivity type layer, the light-emitting layer, the first conductivity type layer and a first metal layer in this order over a first substrate;
    forming a second metal layer over a second substrate;
    attaching the first substrate and the second substrate to each other by bonding the first metal layer and the second metal layer to each other to form the metal layer; and
    removing, after the act of attaching, the first substrate.

* * * * *